United States Patent
Allen et al.

(10) Patent No.: US 12,324,249 B2
(45) Date of Patent: Jun. 3, 2025

(54) LARGE-AREA SOLAR MODULE VIA CONTINUOUS ADDITIVE LAMINATION METHOD

(71) Applicant: KING ABDULLAH UNIVERSITY OF SCIENCE AND TECHNOLOGY, Thuwal (SA)

(72) Inventors: Thomas Gerald Allen, Thuwal (SA); Emmanuel P. Van Kerschaver, Thuwal (SA); Michele De Bastiani, Thuwal (SA); Ahmed Hesham Balawi, Thuwal (SA); Michael Filipe Salvador, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 18/038,875

(22) PCT Filed: Dec. 10, 2021

(86) PCT No.: PCT/IB2021/061592
§ 371 (c)(1),
(2) Date: May 25, 2023

(87) PCT Pub. No.: WO2022/130153
PCT Pub. Date: Jun. 23, 2022

(65) Prior Publication Data
US 2024/0021745 A1    Jan. 18, 2024

Related U.S. Application Data

(60) Provisional application No. 63/124,954, filed on Dec. 14, 2020.

(51) Int. Cl.
*H10F 19/85* (2025.01)
*H02S 30/20* (2014.01)

(52) U.S. Cl.
CPC ............ *H10F 19/85* (2025.01); *H02S 30/20* (2014.12)

(58) Field of Classification Search
CPC . H01L 31/048; H01L 31/0481; H01L 31/049; H02S 30/20; H02S 20/00;
(Continued)

(56) References Cited

U.S. PATENT DOCUMENTS

| 4,210,462 A | 7/1980 | Tourneux |
| 9,147,788 B2 | 9/2015 | DeGroot et al. |

(Continued)

FOREIGN PATENT DOCUMENTS

| CN | 201758128 U | 3/2011 |
| CN | 102244121 B | 8/2013 |

(Continued)

OTHER PUBLICATIONS

Cn 201758128U English machine translation (Year: 2011).*
(Continued)

*Primary Examiner* — Andrew J Golden
(74) *Attorney, Agent, or Firm* — PATENT PORTFOLIO BUILDERS PLLC

(57) ABSTRACT

A photovoltaic, PV, module includes plural PV sections, each PV section including plural lamellas. A first lamella of the plural lamellas includes a back sheet, a first encapsulant material, a PV cell, a foldable material, a second encapsulant material, and a front sheet. The first encapsulant material bonds the PV cell to the back sheet, and the second encapsulant material bonds the PV cell to the front sheet. A first edge of the foldable material is sandwiched between the first and second encapsulant materials of the first lamella and a second edge of the foldable material is sandwiched between corresponding first and second encapsulant materials of a second lamella of the plural lamellas.

17 Claims, 20 Drawing Sheets

(58) Field of Classification Search
CPC ........ H02S 20/30; H10F 19/80; H10F 19/804; H10F 19/85
See application file for complete search history.

(56) References Cited

U.S. PATENT DOCUMENTS

| | | | |
|---|---|---|---|
| 10,457,012 | B2 | 10/2019 | Jung et al. |
| 2012/0073623 | A1 | 3/2012 | Jones et al. |
| 2013/0008483 | A1 | 1/2013 | Chaney |
| 2018/0097472 | A1 | 4/2018 | Anderson et al. |
| 2018/0331652 | A1 | 11/2018 | Okawa et al. |
| 2020/0266759 | A1 | 8/2020 | Okawa et al. |

FOREIGN PATENT DOCUMENTS

| | | |
|---|---|---|
| CN | 103311347 A | 9/2013 |
| CN | 203325942 U | 12/2013 |
| CN | 104377251 A | 2/2015 |
| CN | 106183225 A | 12/2016 |
| CN | 109326717 A | 2/2019 |
| CN | 110634997 A | 12/2019 |
| CN | 105776126 B | 3/2020 |
| DE | 202009005897 U1 | 7/2009 |
| EP | 1113942 A1 | 7/2001 |
| JP | H04320380 A | 11/1992 |
| JP | H1065191 A | 3/1998 |
| JP | 2019192900 A | 10/2019 |
| WO | 2016065936 A1 | 5/2016 |
| WO | 2020157556 A1 | 8/2020 |

OTHER PUBLICATIONS

Chen, H.-W., et al., "Full-Surface Lamination for Large-Scale Solar Module Encapsulation," Renewable Energy World, Mar. 1, 2009, www.renewableenergyworld.com/storage/full-surface-lamination-for-large-scale-solar-module-encapsulation/#gref.

International Search Report in corresponding/related International Application No. PCT/IB2021/061592, date of mailing Mar. 2, 2022.

Tanner, D., et al., "Large Area Thin Film Solar Module Lamination," uploaded May 19, 2016, www.pv-tech.org.

Wang, G., et al., "Large-Area Organic Solar Cells: Material Requirements, Modular Design, and Printing Methods," Advanced Materials, Dec. 3, 2018, vol. 31, pp. 1805089 1-34, WILEY-VCH Verlag Gmbh & Co. KGaA, Weinheim.

Written Opinion of the International Searching Authority in corresponding/related International Application No. PCT/IB2021/061592, date of mailing Mar. 2, 2022.

Communication pursuant to Article 94(3) EPC in corresponding/related European Application No. 21827658.2, dated Dec. 11, 2024.

* cited by examiner

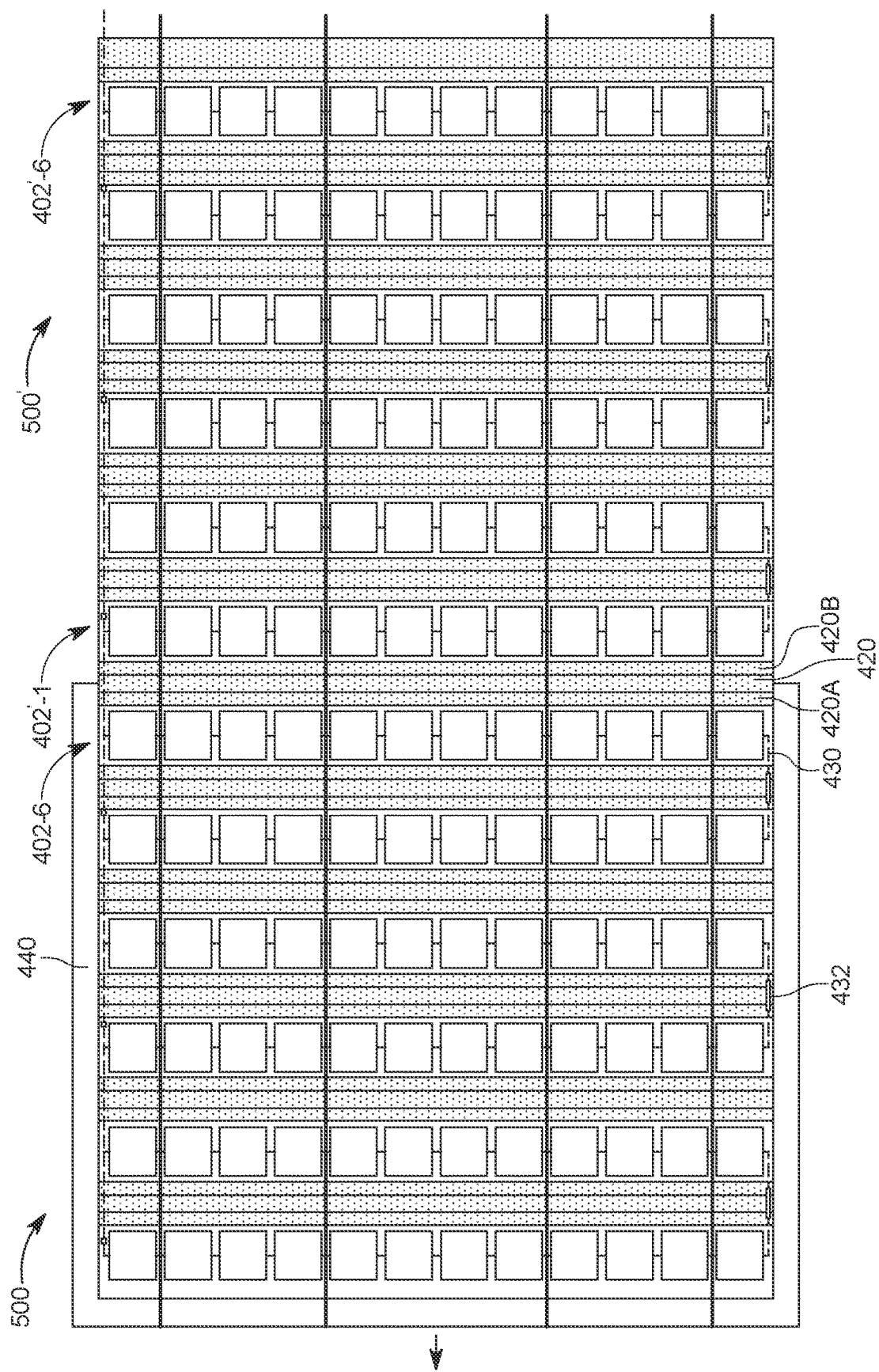

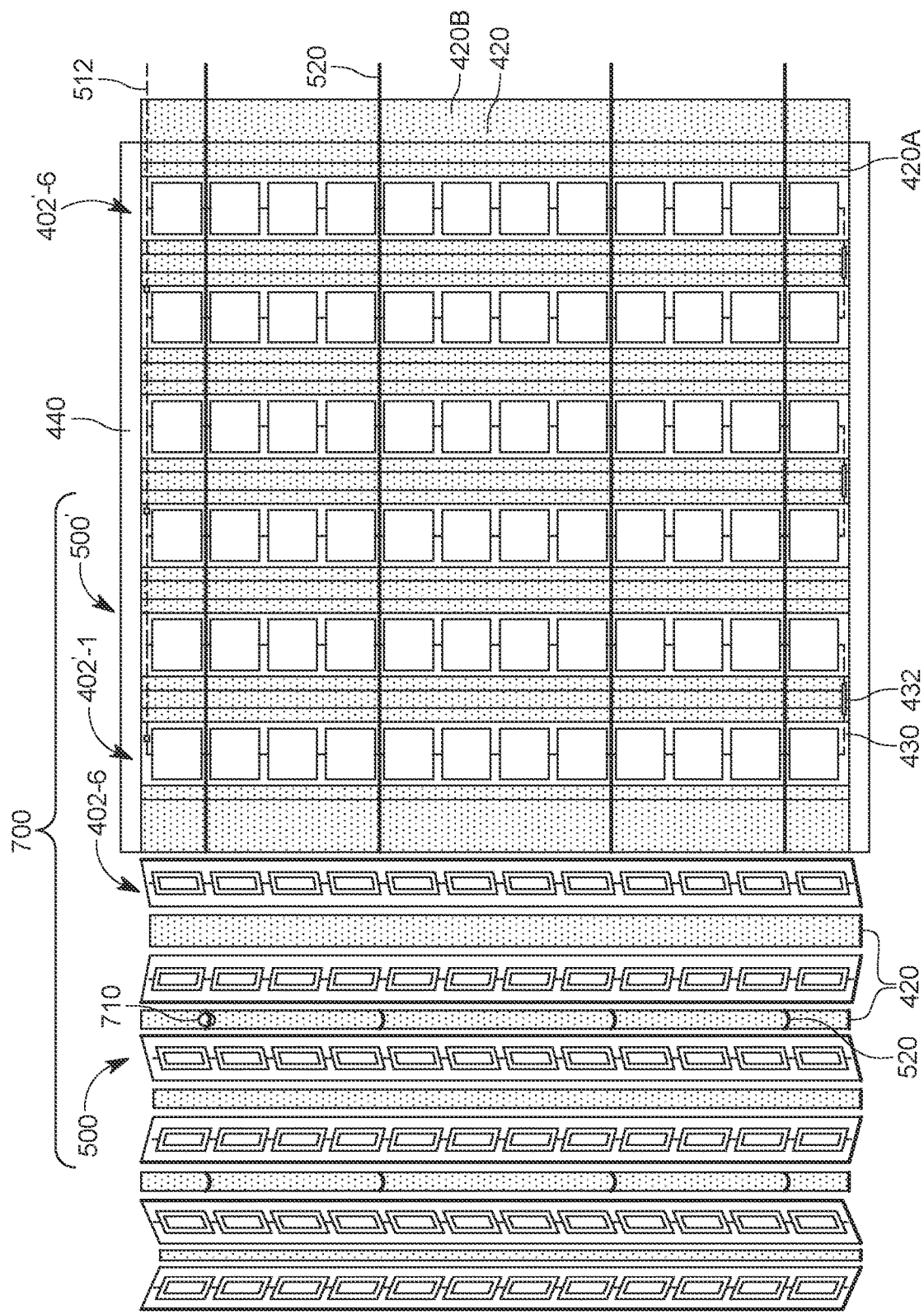

```
┌─────────────────────────────────────────────────────┐
│ LAYING UP PLURAL LAMELLAS TO FORM A FIRST PV SECTION,│
│ THE PLURAL LAMELLAS FITTING AT THE SAME TIME IN A   │
│ VACUUM LAMINATOR, WHERE A FIRST LAMELLA OF THE      │──1500
│ PLURAL LAMELLAS INCLUDES, IN THIS ORDER, A BACK     │
│ SHEET, A FIRST ENCAPSULANT MATERIAL, A PV CELL, A   │
│ FOLDABLE MATERIAL, A SECOND ENCAPSULANT MATERIAL,   │
│ AND A FRONT SHEET                                   │
└─────────────────────────────────────────────────────┘
                          │
                          ▼
┌─────────────────────────────────────────────────────┐
│ PLACING THE PV SECTION INSIDE THE VACUUM LAMINATOR  │──1502
└─────────────────────────────────────────────────────┘
                          │
                          ▼
┌─────────────────────────────────────────────────────┐
│ HEATING THE VACUUM LAMINATOR TO (1) MELT THE FIRST  │
│ ENCAPSULANT MATERIAL TO BOND THE PV CELL TO THE     │
│ BACK SHEET, (2) MELT THE SECOND ENCAPSULANT         │
│ MATERIAL TO BOND THE PV CELL TO THE FRONT SHEET,    │
│ AND (3) MELT THE FIRST AND SECOND ENCAPSULANT       │──1504
│ MATERIALS TO BOND A FIRST EDGE OF THE FOLDABLE      │
│ MATERIAL IN THE FIRST LAMELLA AND A SECOND EDGE     │
│ OF THE FOLDABLE MATERIAL TO A SECOND LAMELLA OF     │
│ THE PLURAL LAMELLAS                                 │
└─────────────────────────────────────────────────────┘
                          │
                          ▼
┌─────────────────────────────────────────────────────┐
│ APPLYING VACUUM IN THE VACUUM LAMINATOR WHILE       │──1506
│ HEATING TO REMOVE ANY BUBBLES                       │
└─────────────────────────────────────────────────────┘
```

FIG. 15

LARGE-AREA SOLAR MODULE VIA CONTINUOUS ADDITIVE LAMINATION METHOD

CROSS-REFERENCE TO RELATED APPLICATIONS

This application is a U.S. National Stage Application of International Application No. PCT/IB2021/061592, filed on Dec. 10, 2021, which claims priority to U.S. Provisional Patent Application No. 63/124,954, filed on Dec. 14, 2020, entitled "LARGE-AREA SOLAR MODULE VIA CONTINUOUS ADDITIVE LAMINATION PROCESS," the disclosures of which are incorporated herein by reference in their entirety.

BACKGROUND

Technical Field

Embodiments of the subject matter disclosed herein generally relate to a system and method for manufacturing a large-area solar module that is not limited by the current sizes of the vacuum laminators, and more particularly, to a process for continuously increasing the size of a solar module by additive lamination until reaching the desired length, which is not impacted by the size limitations of the available vacuum laminators.

Discussion of the Background

Next to large scale deployment in massive solar farms, integrating photovoltaic energy generation in the already developed areas of the planet remains a core market for this renewable energy source. Typical examples are integrating the photovoltaic panels directly into building façades (Building Integrated PhotoVoltaics, BIPV) or co-developing the same area of land for both solar photovoltaic power as well as for agriculture (AgriVoltaics). In the context of BIPV and Agrivoltaics, the photovoltaic panel or module can serve a double functionality (1) of providing controlled amounts of shade and (2) transforming the excess sunlight into locally generated useful electrical power.

Manufacturing these photovoltaic active panels used in such systems requires a vacuum laminator and associated vacuum lamination step to protect the fragile photovoltaic active devices (strings of solar cells) from degradation, and the surroundings from the high system voltages inside the packaged cells. In many of these applications however, the area that each of these individual photovoltaic active panels has to cover (typically >10 m$^2$) is far beyond the dimensions of the commercially available vacuum laminators. Even though it would be conceivable to design and engineer custom sized laminators with large enough footprint for standardized products, the variability of the applications of the photovoltaic active panels requires to maintain full flexibility and modularity on the dimensions of the produced panels. Besides, such a large-area custom sized laminator would potentially be extremely costly and difficult/expensive to ship to the customers.

In addition, the deployment of the photovoltaic active panels for BIPV or Agrivoltaics applications relies on very different architectural concepts when compared with the conventional structures of the solar farms. For instance, the ability of moving the individual panels of the photovoltaic active panels, by securing them onto a motorized structure through a hanging mechanism, could be highly desirable in order to achieve dynamic lighting conditions.

Thus, there is a need for a new process that is capable of forming any desired size photovoltaic active panel, irrespective of the size of the available vacuum laminator, so that the final product fits any desired application, be it in the BIPV or AgriVoltaics field or any other field.

BRIEF SUMMARY OF THE INVENTION

According to an embodiment, there is a photovoltaic, PV, module that includes plural PV sections, each PV section including plural lamellas. A first lamella of the plural lamellas includes a back sheet, a first encapsulant material, a PV cell, a foldable material, a second encapsulant material, and a front sheet. The first encapsulant material is configured to bond the PV cell to the back sheet, and the second encapsulant material is configured to bond the PV cell to the front sheet. A first edge of the foldable material is sandwiched between the first and second encapsulant materials of the first lamella and a second edge of the foldable material is sandwiched between corresponding first and second encapsulant materials of a second lamella of the plural lamellas.

According to another embodiment, there is a method for manufacturing a photovoltaic, PV, module. The method includes laying up plural lamellas to form a first PV section, the plural lamellas fitting at the same time in a vacuum laminator, wherein a first lamella of the plural lamellas includes a back sheet, a first encapsulant material, a PV cell, a foldable material, a second encapsulant material, and a front sheet, placing the PV section inside the vacuum laminator, heating the vacuum laminator to melt the first encapsulant material to bond the PV cell to the back sheet, melt the second encapsulant material to bond the PV cell to the front sheet, and melt the first and second encapsulant materials to simultaneously bond a first edge of the foldable material in the first lamella and a second edge of the foldable material to a second lamella of the plural lamellas, and applying vacuum in the vacuum laminator while heating.

According to still another embodiment, there is a photovoltaic, PV, module that includes plural PV sections, each PV section including plural lamellas. Each lamella of the plural lamellas includes a foldable material, a first encapsulant material, a back sheet, a second encapsulant material, a PV cell, a third encapsulant material, and a front sheet. The second encapsulant material is configured to bond the PV cell to the back sheet, and the third encapsulant material is configured to bond the PV cell to the front sheet. Each lamella of the plural lamellas is bonded to the foldable material by the first encapsulating material.

According to yet another embodiment, there is a method for manufacturing a photovoltaic, PV, module, and the method includes laying up a foldable material, laying up plural lamellas over a first region of the foldable material to form a first PV section, the plural lamellas fitting at the same time in a vacuum laminator, wherein a first lamella of the plural lamellas includes, a first encapsulant material, a back sheet, a second encapsulant material, a PV cell, a foldable material, a third encapsulant material, and a front sheet, placing the PV section and the first region of the foldable material inside the vacuum laminator, heating the vacuum laminator to melt the first encapsulant material to bond each lamella of the plural lamellas to the foldable material, the second encapsulant material to bond the PV cell to the back sheet, and the third encapsulant material to bond the PV cell to the front sheet, and applying vacuum in the vacuum laminator while heating.

BRIEF DESCRIPTION OF THE DRAWINGS

For a more complete understanding of the present invention, reference is now made to the following descriptions taken in conjunction with the accompanying drawings, in which:

FIG. 6 illustrates the first photovoltaic section being fully inside the laminator for being laminated while the second photovoltaic section is laid-up in anticipation of its lamination and a region of a foldable material from the first section extends through the laminator and is part of the second section;

FIG. 7 illustrates the first photovoltaic section being taken out of the laminator and being folded while the second section is placed into the laminator for lamination;

FIG. 15 is a flow chart of a method for forming one or more of the photovoltaic modules noted above.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to laminating plural photovoltaic lamellas to obtain a desired length module that is not bound in size by the available vacuum laminator. However, the embodiments to be discussed next are not limited to photovoltaic elements, but may be applied to other systems.

References throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a new type of large-area photovoltaic module or panel that is much larger than the footprint of the conventional laminators is discussed. According to the new process used to manufacture this module, there is no practical limit as to the length of the photovoltaic modules produced through this process. This new type of module contains features for realizing properties such as light management, air flow control and a mechanism for hanging the panels, and all these features are realized through a single, in-lamination process, which otherwise would have to be accomplished through multiple post-lamination steps. Therefore, the process to be discussed next not only extends the length of the module to any desired value, but also saves manufacturing time and cost.

Before discussing the novel process, it is believed that a brief discussion of a conventional process of manufacturing a photovoltaic module is in order. Note that the term "photovoltaic module" is understood herein to be a device that includes plural photovoltaic cells, which are electrically connected to each other, and which are also mechanically connected to each other. While such a photovoltaic module may be solid, i.e., those modules that are currently used for photovoltaic farms as they include glass layers and also a rigid frame, the photovoltaic module to be discussed herein is soft, i.e., it can be folded or rolled to reduce its footprint as it does not include either a glass layer or a rigid frame.

Figure 1:
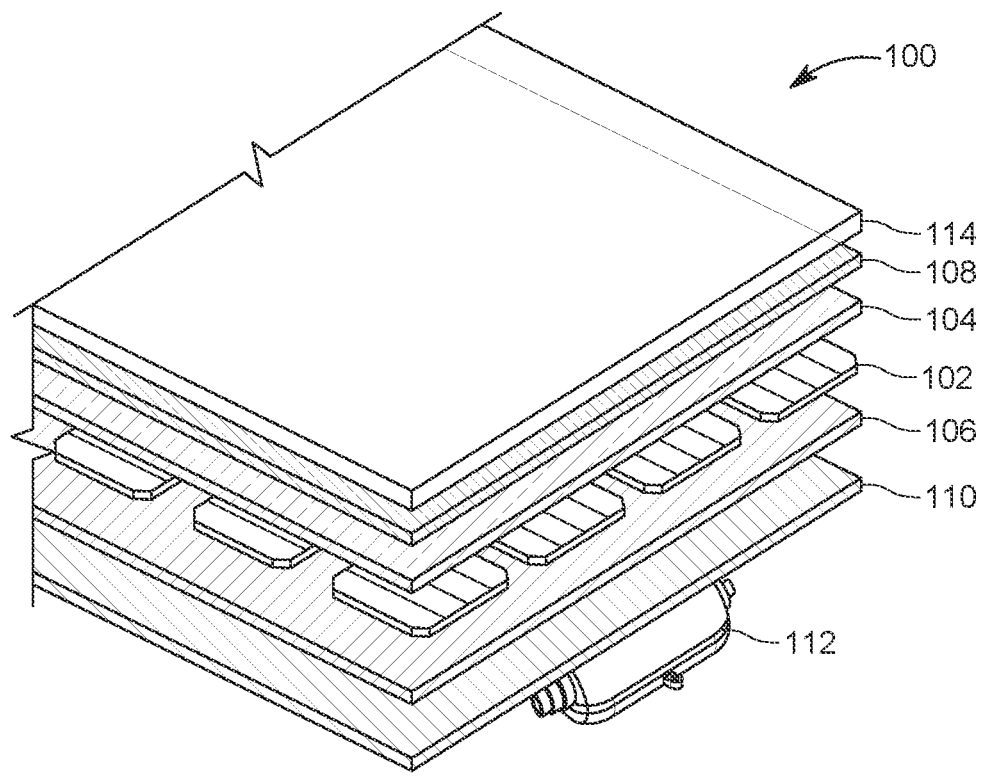
FIG. 1 is a schematic diagram of a photovoltaic module.

Vacuum lamination is the industry standard process to ensure the longevity of the fragile solar cells of a photovoltaic module based on silicon wafers as the cells need to be able to withstand outdoor exposure in all types of climates for periods of 25 years and more. During the lamination process of a standard photovoltaic module 100, which is illustrated in FIG. 1, the solar cells 102 are encapsulated in between a number of layers, including top and bottom encapsulant materials 104 and 106, a highly transparent tempered glass layer 108 placed on the top of the module, an insulating back sheet 110 (e.g., TPT (Tedlar-polyester-Tedlar)) placed at the bottom of the module, a junction box 112 for achieving electrical connection of the module with a next module, and an anodized aluminum frame 114 for holding together the module. The layer stack is known as the "lay-up." The encapsulant materials 104 and 106 act as the adhesive when annealed to temperatures beyond their melting temperature.

Figure 2:
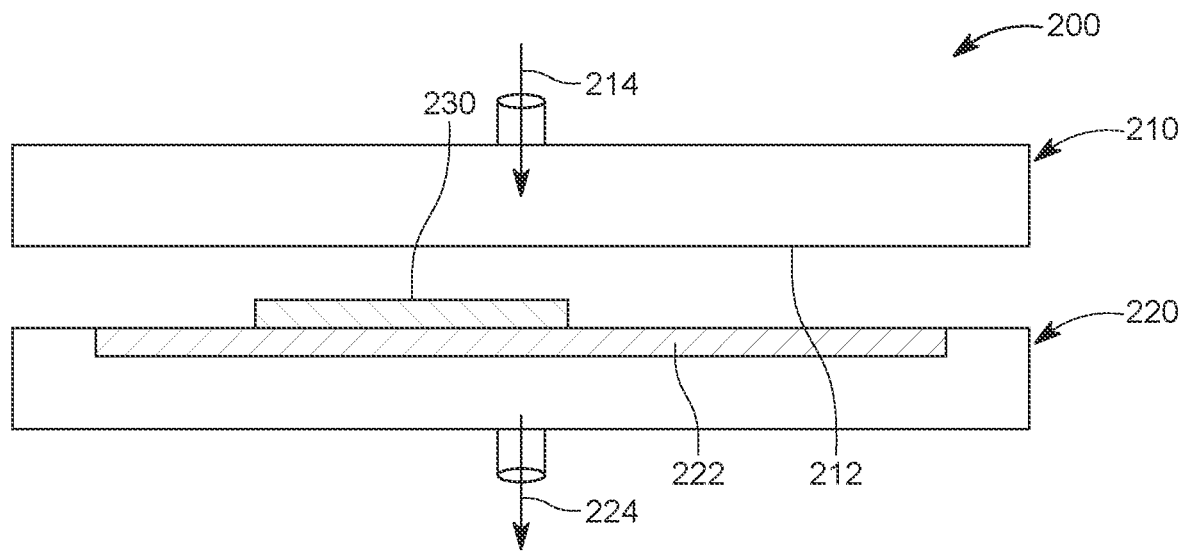
FIG. 2 is a schematic diagram of a vacuum laminator that is used to laminate a photovoltaic module.

The most common way to laminate solar panels is by using a vacuum lamination machine. Although the method has many disadvantages, it is used by the large majority of solar panel manufacturers. Industrial flat plate vacuum laminators 200 are basically a very extended dual vacuum chamber having a top half 210 and a bottom half 220, as shown in FIG. 2. The top half and the bottom half of the chambers are separated by a flexible membrane 212 and can individually be pressurized or evacuated. During the lamination process, air is evacuated from both halves so that the encapsulant material can melt and the trapped air can be removed, after which air is pumped into the top half 210, as illustrated by arrow 214, which results in air being evacuated from the bottom half 220, as illustrated by arrow 224, so that the membrane presses on the laminate to assure a good adhesion between all the layers. The module lay-up 230 is placed in the bottom half 220 of the chamber, which includes a metal plate 222 that can be heated to elevated temperatures. After sealing the chamber, i.e., contacting the top half to the bottom half, heat is applied to the metal plate 222 so that the module lay-up 230 is heated to melt, and if needed, cross-link the encapsulant. Then, air is provided to the top half 210 and evacuated from the bottom half 220, creating a low-level vacuum to avoid bubble formation. By pressuring the top half 210, pressure can be applied to the product to ensure a good surface contact and adhesion between the different layers of the photovoltaic (PV) module.

One of the major disadvantages of vacuum lamination is that the process is relatively slow and often forms the production bottleneck. This has led to the development of large (and even very large area) vacuum laminators to enable processing multiple modules in parallel, but the process remains intrinsically a discrete process with the area of the laminator defining the largest possible module that could be made.

Other, less common module manufacturing processes for niche markets, for instance in the case of organic photovoltaics and copper indium gallium selenide (CIGS) solar cells, may include printing, coating and evaporation techniques on flexible substrates using a continuous roll-to-roll process. However, these processes are not compatible with the existing silicon wafer technologies.

To integrate the PV sections into a large module, here also called solar screen, for applications with large footprints, such as greenhouses, the module has to be able to extend over a length of more than 5 m at widths of 2 m and more. This area is beyond the area of conventional vacuum laminators and larger than the largest available commercial laminator to date. Furthermore, it would be highly desirable to manufacture the PV modules such that they are lightweight, easily customizable, not only in shading levels but also in length, and scalable. To achieve one or more of these goals, the following solutions were developed.

Figure 3A:
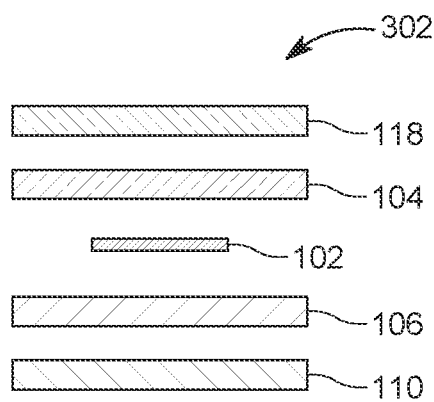
FIG. 3A schematically illustrates the layer structure of a photovoltaic lamella while FIG. 3B schematically illustrates a photovoltaic module being formed with two lamellas.
Figure 3B:
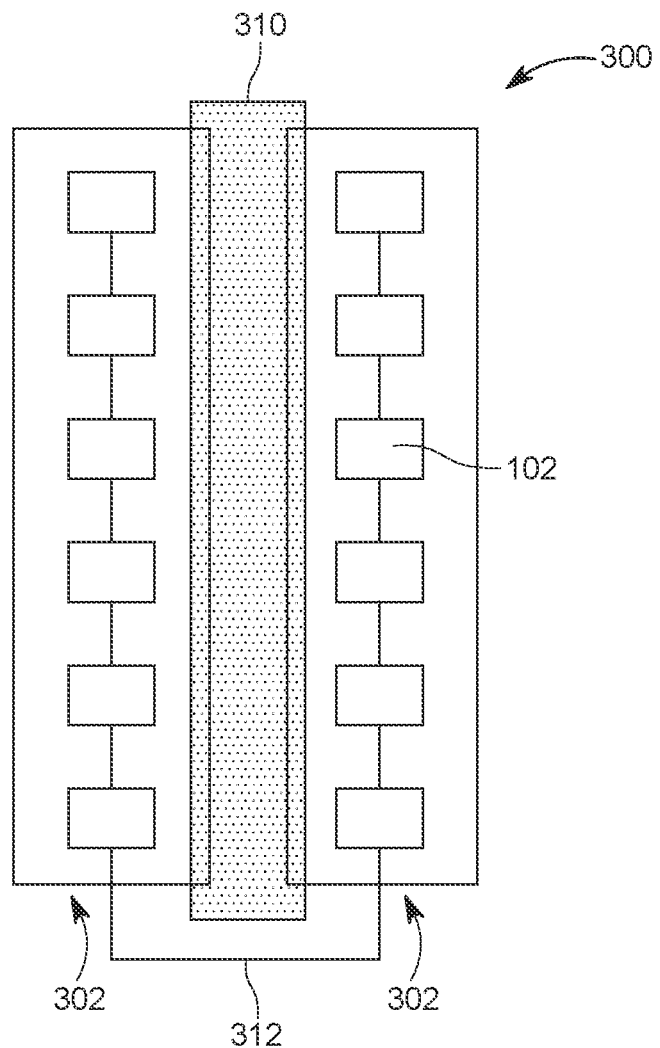

One way to build a large PV module 300, without being bounded by the size of the vacuum laminator, is to form individual PV lamellas 302, as shown in FIG. 3A (the figure shows a cross-section of the lamella), and then to attach, post-lamination, plural PV lamellas 302 by stitching or gluing the lamellas to each other using a connecting material 310, as shown in FIG. 3B (only two lamellas are shown for simplicity, but any number of lamellas may be connected together to form the PV module) and as discussed in [1]. In other words, these lamellas are mechanically connected to each other using tape, staples, stitching or a similar method, up to the required length of the screen. In order to be able to complete the electrical circuit of the photovoltaic panel, electrical wires 312 protruding from each lamella are used to connect to the network of embedded photovoltaic cell strings. These wires 312 had to be electrically connected, e.g., by soldering, to the matching electrical wires from the neighboring lamellas. Beyond electrically connecting the wires, sufficient isolation shielding of each of these electrical contact points is required to ensure the safety around these high voltage panels. This step requires extensive post-lamination handling, significantly impacting the production yield as each of these post-lamination connections increases the risk of product failure. In other words, this process has a lamination step (as illustrated in FIG. 3A) followed by one or more post lamination steps (as illustrated in FIG. 3B).

Figure 4A:
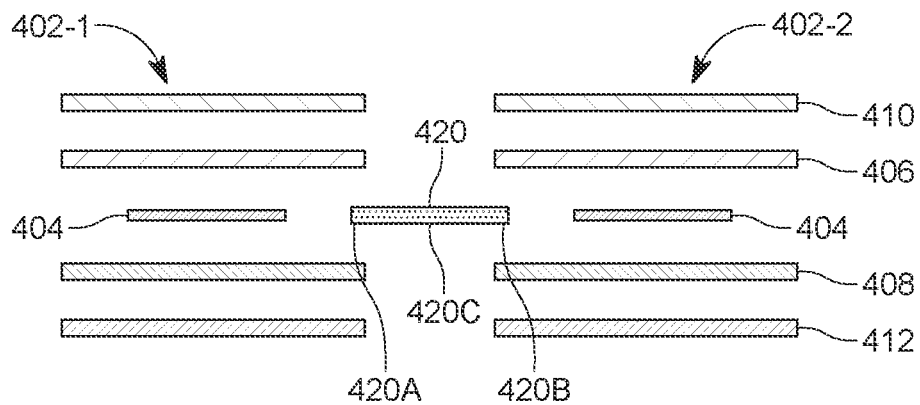
FIG. 4A schematically illustrates the layer structure of another photovoltaic lamella that uses a foldable material as a seam between two adjacent lamellas.

However, according to an embodiment, the post lamination steps are reduced or even eliminated as all the operations noted above are moved to the in-lamination step. More specifically, as shown in FIG. 4A, the lay-up process includes spacing plural lamellas out while using an additional foldable material 420, as a foldable seam between two lamellas 402-1 and 402-2. In other words, after the back sheet 412 and the bottom encapsulant 408 are placed to start forming the two lamellas 402-1 and 402-2, the foldable material 420 is placed to straddle both lamellas, as shown in FIG. 4A, and a corresponding PV cell 404 is placed on top of each of the bottom encapsulant. Note that only two edge areas 420A and 420B of the foldable material 420 are placed to be captured by the corresponding lamellas, while most of the area 420C of the foldable material 420 is left free. The ratio of the areas (i) (420A+420B) and (ii) 402C is smaller than one in one embodiment. In another embodiment, this ratio is one. In the embodiment shown in FIG. 4A, the two adjacent PV cells 404 and the foldable material 420 extend in the same plane when the module is not retracted or rolled. The back sheet 412 and the front sheet 410 may be made of TPT or other light and flexible materials, e.g., plastic, but not glass. Also, there is no rigid frame to be attached to any of the lamellas.

Figure 4B:
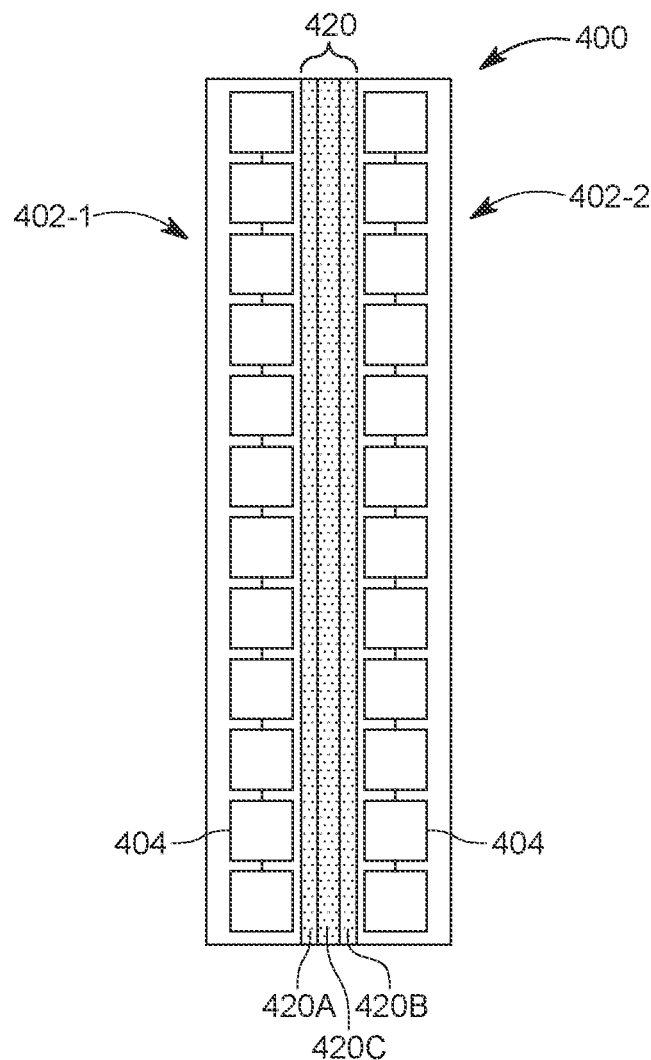
FIG. 4B illustrates how the foldable material connects the two adjacent lamellas.
Figure 4C:
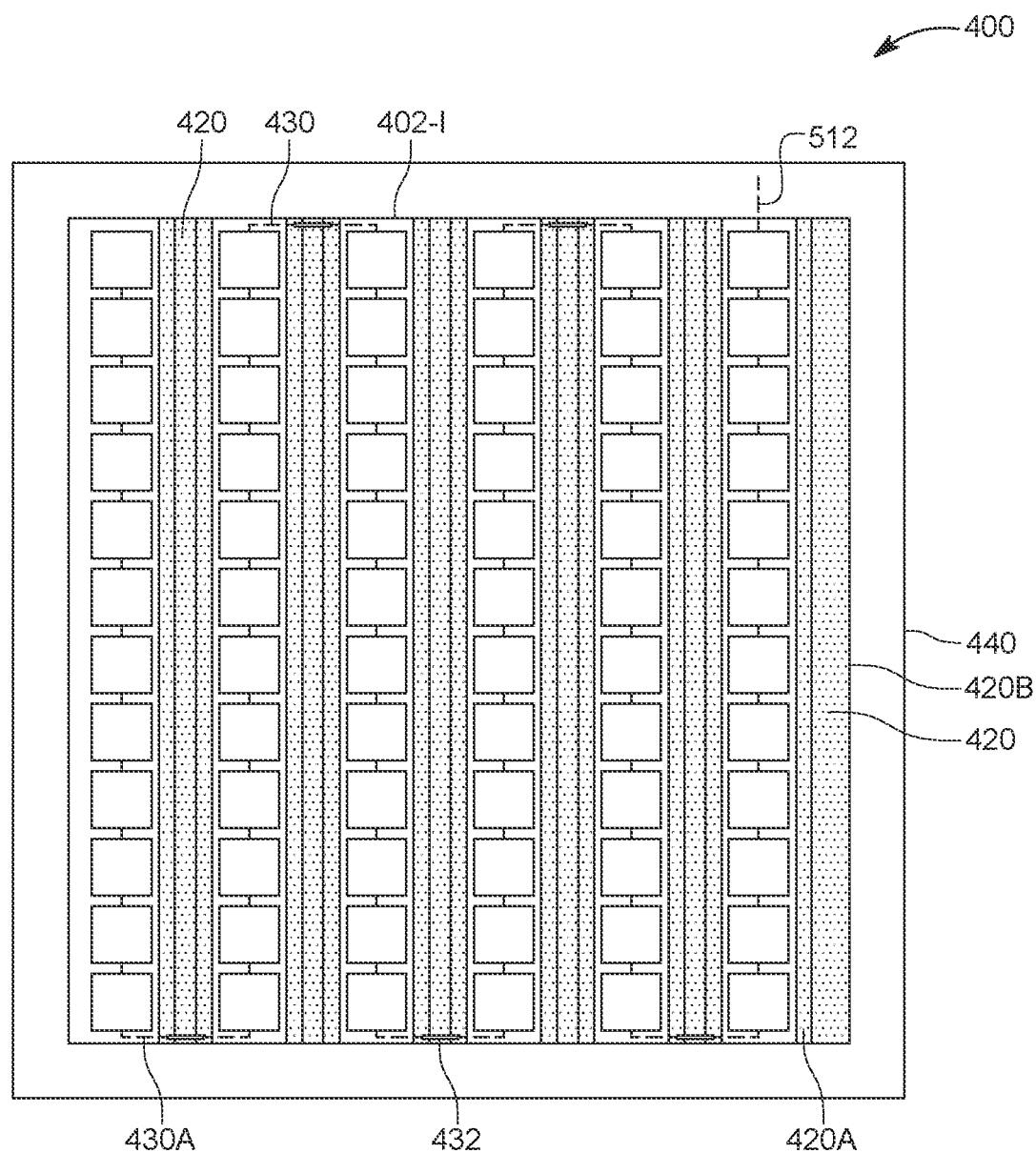
FIG. 4C illustrates how the photovoltaic module formed based on the photovoltaic lamellas fully occupies the inside active area of a vacuum laminator.

Next, the top encapsulant 406 and the front sheet 410 are placed over the PV cells 404 and the foldable material 420 and the obtained section 400, which is partially shown in FIG. 4B, as more lamellas form one section, is ready to enter the laminator. Thus, in this embodiment, the encapsulant of the PV cells 404 is also used to partially laminate and fully secure the foldable material 420 to two adjacent lamellas. At this point, rather than laminating individual lamellas, larger sections of the screens are built, i.e., as many lamellas are laid-up as shown in FIG. 4C, up to the effective area 440 of the vacuum laminator. In this embodiment, the section 400 includes 6 lamellas **402-*l*, with l=6, but the number of lamellas forming one section is dictated by the size of the lamella and the size of the active area of the vacuum laminator. The electrical connections 430 between lamellas of the same section 400 are formed before the lamination step. Also before the lamination step, the exposed electrical wires 430 between the adjacent lamellas are electrically insulated, for example, with an insulation material 432. The figures show the insulation material 432 added to the electrical wires between only two lamellas for simplicity, but one skilled in the art should understand that all exposed electrical wires are covered by corresponding insulation materials 432. Note that the portions 430A of the electrical wires 430 that do not extend beyond the lamella are not insulated, as they are laminated and the top and bottom layers 410 and 412 shown in FIG. 4A offer the insulation. Only the regions of the electrical wires 430 that extend over the foldable material 420 are protected with the insulation material 432. Thus, the sections 400** formed in this way are then mechanically and electrically connected together, in a post-lamination step. However, all the mechanical and electrical connections between the lamellas of a single section are performed pre- or in-lamination.

One advantage of this approach is that all the electrical connections within such a section can be done at the stage of building up the sections and post-lamination electrical interconnections and isolation of exposed electrical leads is limited to the seam areas, i.e., foldable material 420, which extends in between the adjacent sections 400. It is also noted that each section 400 starts with a lamella 402 and ends with the foldable material 420, so that after the lamination step, the free region 420B of the foldable material 420 can be attached to the next section 400. For this embodiment, although strongly reduced, the need for additional processing of the sections after the lamination step, to realize the mechanical and electrical interconnections, to achieve a large solar module remains and might impose risks on safety and product integrity.

Thus, another novel method for circumventing the above described additional post-lamination interconnecting steps of the separate sections has been developed by embedding the foldable material or seam 420 in between adjacent lamellas of neighboring sections, in the corresponding lamella during consecutive lamination cycles. According to this embodiment, a method is devised to make lightweight, glass-free, vacuum laminated solar screens of any length, beyond the dimensions of any flat plate vacuum laminator, without the need to separately attach, post-lamination, the processed sections. This method allows the integration of other electrical and mechanical elements that would otherwise have to be integrated post-lamination. This includes in-laminated bypass diodes for managing shading losses, in-laminated hanging wires for mechanical hanging and retraction of the solar module, and in-laminated interconnection (seaming) material with added functionality to control light transmission and air permeation.

Figure 5A:
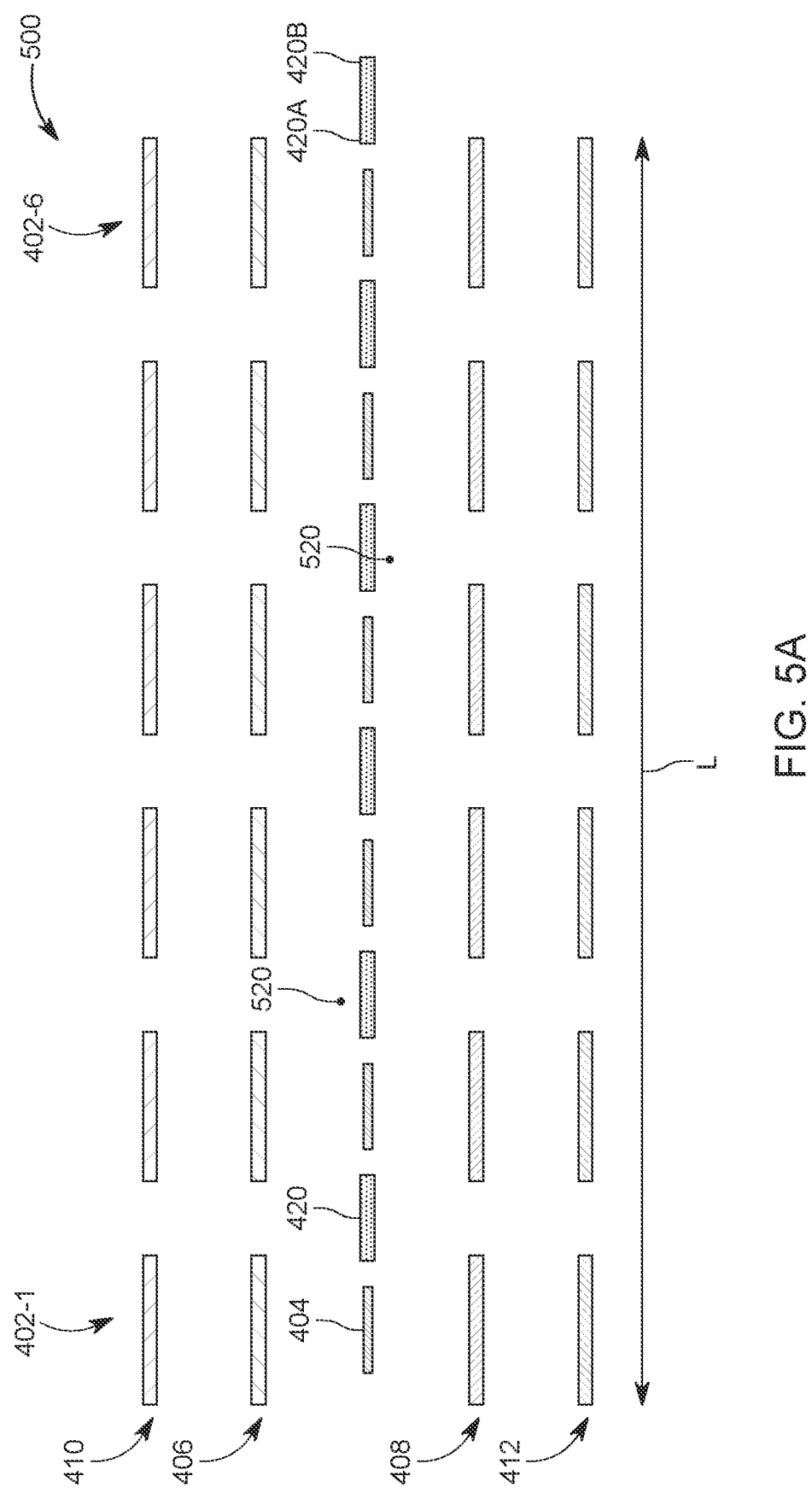
FIG. 5A schematically illustrates the layer structure of a photovoltaic section that includes plural lamellas.
Figure 5B:
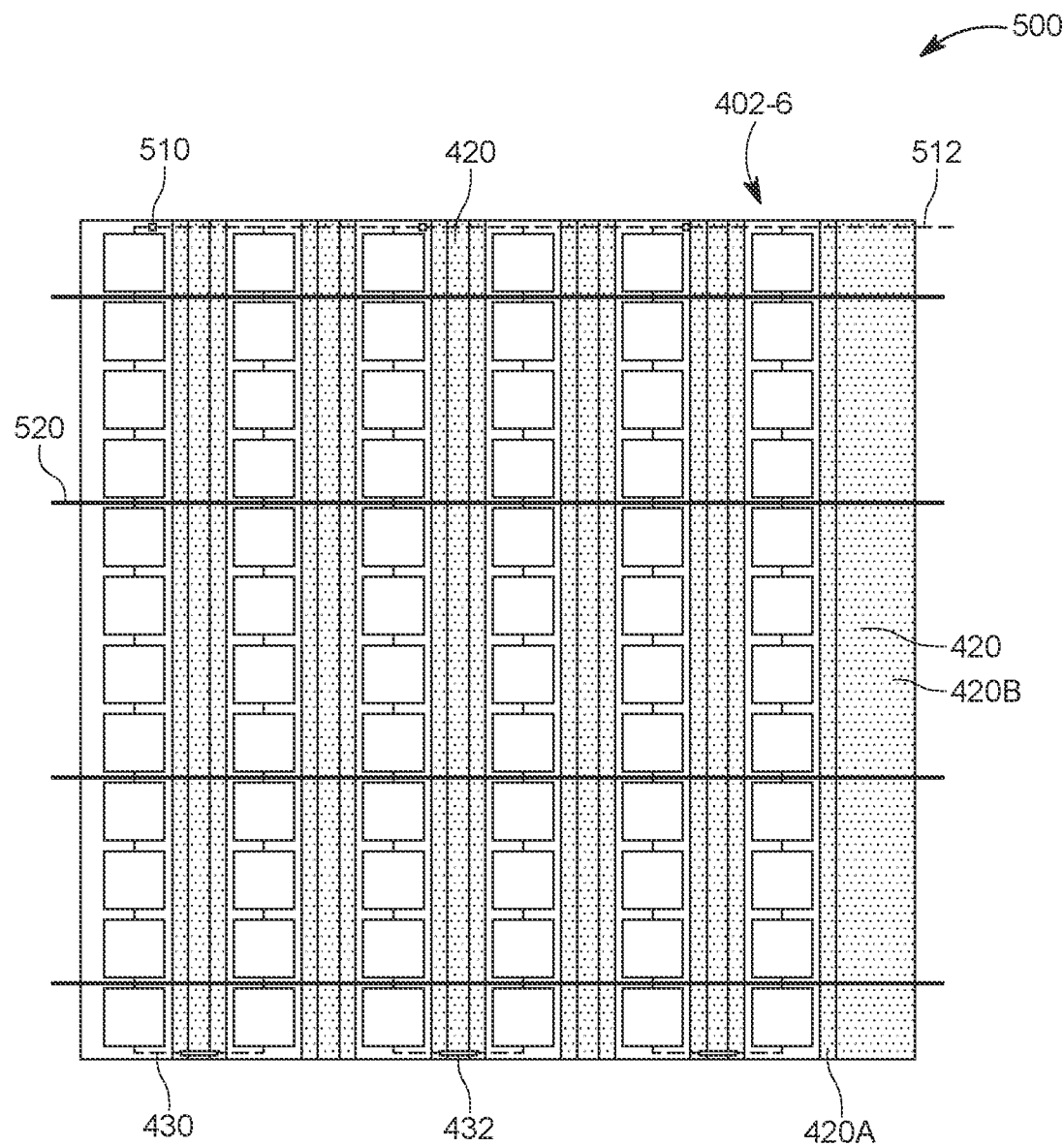
FIG. 5B shows a top view of the photovoltaic section with an edge of a foldable material being free.

According to this embodiment, one side 420A of the foldable material 420 is embedded and laminated into the final lamella 402-6 of a given section 500, as shown in FIG. 5A, which is a cross-section of the section 500, and also shown in FIG. 5B, which is a top view of the section 500, and the other side 420B is left free, to extend out from the section. The section 500 includes as many lamellas as would fit into the vacuum laminator. FIG. 5B also shows the electrical wires 430 connecting adjacent lamellas already being connected to each other, prior to the lamination step. FIG. 5B further shows bypass diodes 510, and exposed electrical leads 512 that are connected to a corresponding electrical lead of the next section. Note that the insulation material 432 is already covering the portions of the electrical wires 430 that would be exposed after the lamination step. Further, the figures show one or more hanging wires 520 embedded between the encapsulation layers 406 and 408 and extending along a length L of the section 500. The hanging wire 520 may be located above or below the foldable (seam) material 420, as schematically illustrated in FIG. 5A. While the length L of the section 500 is limited by the vacuum laminator, the length of the module (made of the all the sections 500) is not limited.

Figure 5C:
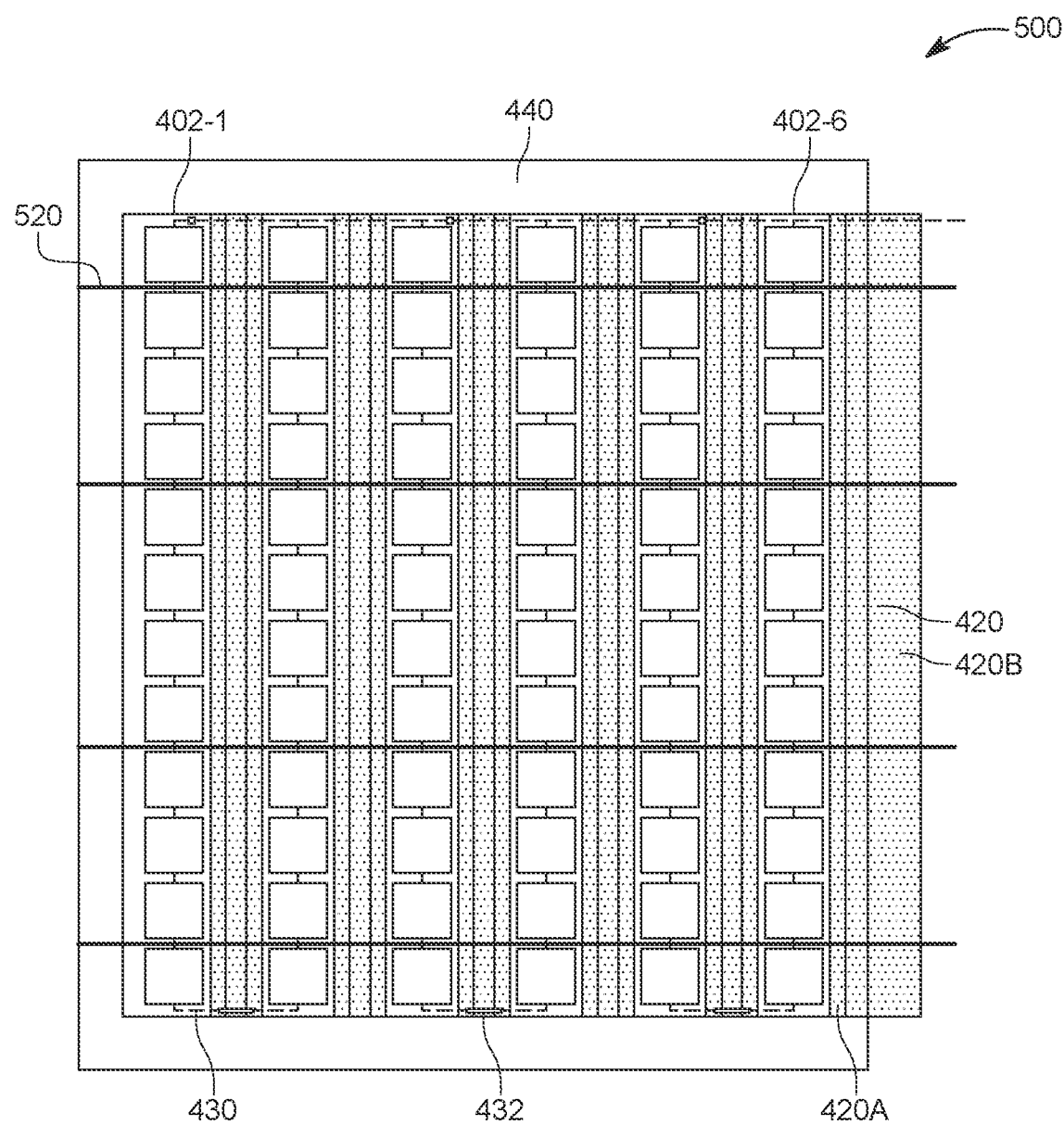
FIG. 5C shows the photovoltaic section being placed inside the vacuum laminator while a portion of the foldable material extending outside the laminator.

Next, the laid-up section 500 is placed in the active area 440 of the vacuum laminator, as shown in FIGS. 5C and 6, and the following section 500' is built up while the section 500 is being laminated. FIG. 5C shows that the edge 420B of the foldable material 420 of the lamella of the section 500 extends outside the laminator 440 while the PV section 500 is fully inside the laminator. This free edge 420B is used to later connect the next PV section 500' to the PV section 500. Note that laminating a section is the step in the process that takes the longest and this step creates the bottleneck during the PV module manufacturing. However, in this embodiment, the time necessary for laminating the section 500, i.e., melting the encapsulant materials 406 and 408, is used to lay-up the next section 500', as illustrated in FIG. 6. The section 500' is formed by embedding the exposed edge 420B of the foldable material 420 of the last lamella 402-6 of the previous section 500, into the first lamella 402'-1 of the next section 500'. Thus, the time necessary for laminating section 500 is used to construct the next section 500', which saves manufacturing time. During the next lamination step, this edge 420B will get bonded within the first lamella 402'-1 of the next section 500', thus realizing a firm bond between the sections 500 and 500'. The already laminated section 500 will remain outside of the laminator with the foldable/seam material 420 itself extending through the vacuum seal of the laminator, as schematically illustrated in FIG. 7.

After the section 500 is laminated, it is moved outside the lamination area 440, as shown in FIG. 7, and the next section 500' is moved inside the lamination area for being laminated. The new section 500' has this time the last lamella 402'-6 laid-up to partially sandwich the foldable material 420 to offer a free edge 420B for the next section, which should be built while the section 500' is being laminated. This process can now be repeated for as long as desired so that a total length of the module 700 formed from the various sections 500, 500', etc. is not bound by the sizes of the laminator. FIG. 7 also shows that the already laminated section 500 can now be folded at the foldable material 420 to not occupy too much space. Note that the top and bottom layers 410 and 412 of each lamella, although made from a flexible material (e.g., plastic), are not as flexible as the foldable material 420 and they cannot be bent more than about 90 degrees while the foldable material 420 may be bent up to 180 degrees to completely fold the sections.

Figure 8:
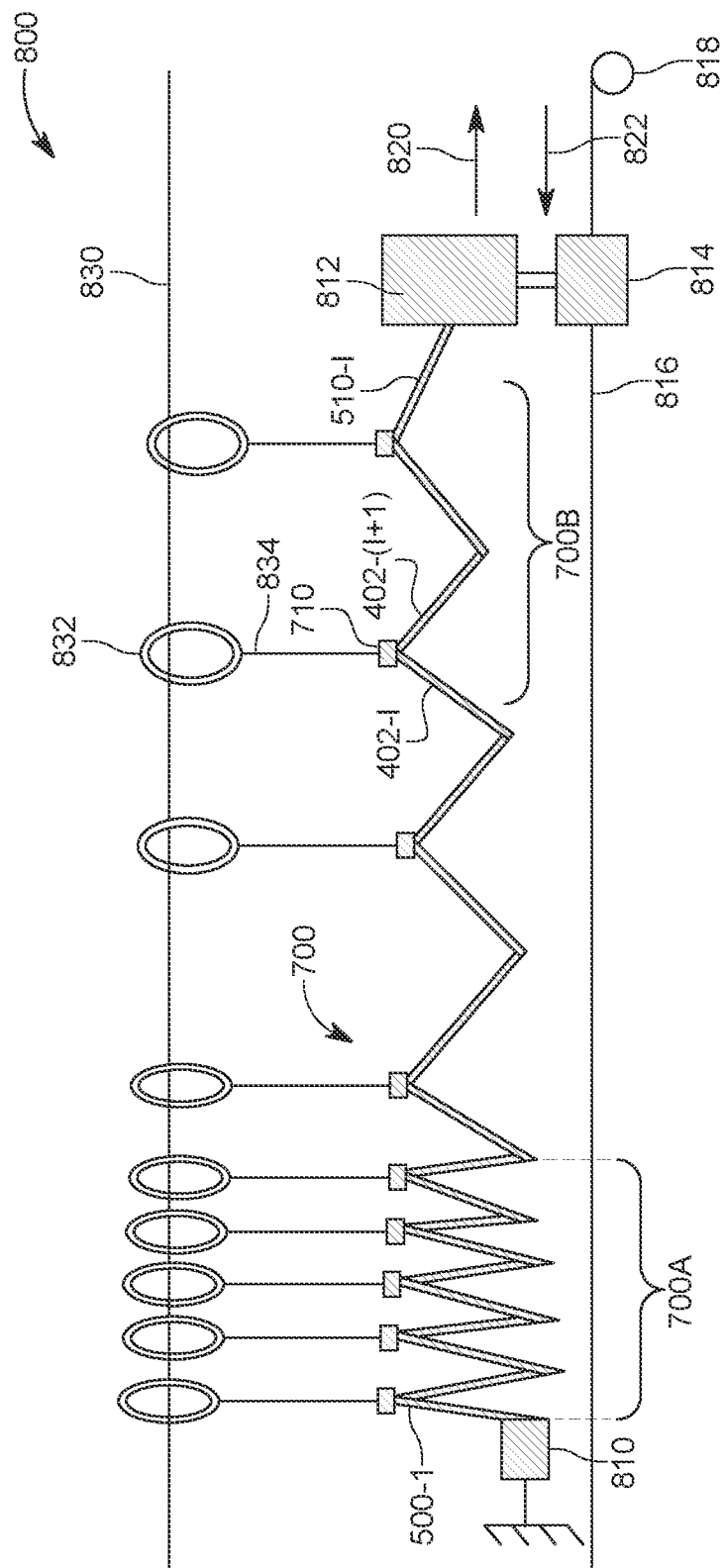
FIG. 8 illustrates a retracting mechanism from which a photovoltaic module is suspended, where the retracting mechanism is configured to extend or retract the photovoltaic module as desired.

Because the hanging wires 520 extend between the various lamellas and are directly exposed to the ambient when crossing over or under the foldable material 420, between two adjacent lamellas, it is possible to provide connecting devices 710 (e.g., hooks) or similar devices that extend around the wires 520 at various locations along each section, as also shown in FIG. 7, so that the entire module 700 can be hooked from a folding system, as shown in FIG. 8.

FIG. 8 shows a part 700A of the PV module 700 being folded while another part 700B is mostly unfolded. Note that the PV module 700 may include any number of sections 500. An end of a first section 500-1 may be attached to a fixed bar 810 while an end of a last section 510-1 may be attached to a pulling bar 812. The pulling bar 812 may be attached, through a connector 814, to a moving cable 816, which is actuated by a motor 818. Depending on the rotation direction of the motor 818, the pulling bar 812 can be moved along direction 820 to unfold (open) the PV module 700 or along direction 822 to fold (close or retract) the PV system 700. Other actuation mechanisms may be used to fold or unfold the PV module 700. The fixed bar, pulling bar, motor, moving cable, etc. that hold and actuate the PV module 700 are part of a actuating mechanism 800.

FIG. 8 further shows a support wire 830, which is also part of the actuating mechanism 800, that is configured to hold the PV module 700 at a desired distance about ground.

Rings or similar devices 832 may be distributed along the support wire 830 and connected through links 834 to corresponding connecting devices 710. In this way, the entire PV module 700 can be positioned at any desired location and can be extended or retracted to cover more or less of a given area.

Figure 9:
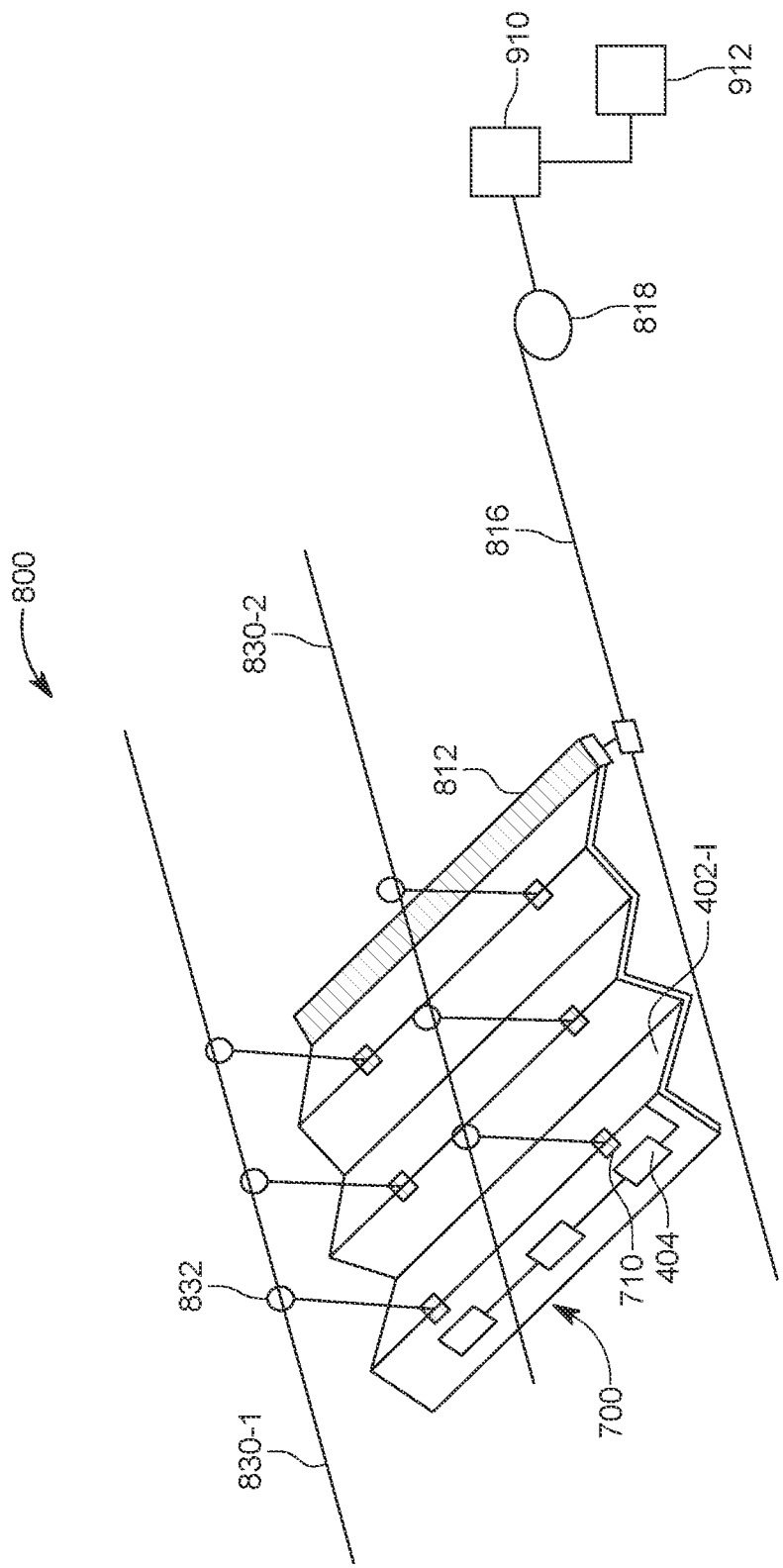
FIG. 9 is a bird view of the retracting mechanism holding the photovoltaic module.

FIG. 9 shows a bird view of the actuating system 800, having the PV module 700 partially open. In this embodiment, there are two supporting cables 830-1 and 830-2 that support the entire PV module 700 and the pulling bar 812 moves along the moving cable 816. The figure also shows a controller 910 and a corresponding light sensor 912, which are configured to control the extension/retraction of the PV module 700 based on various factors, for example, the amount of light detected by the light sensor 912 behind the module. While FIGS. 8 and 9 show the PV module 700 being disposed in a horizontal position, it is also possible that the PV module 700 is attached to the rings 832 in a vertical configuration, like the vertical blinds of a window. In fact, any other position may be used for the PV module 700, depending on the application.

Figure 10A:
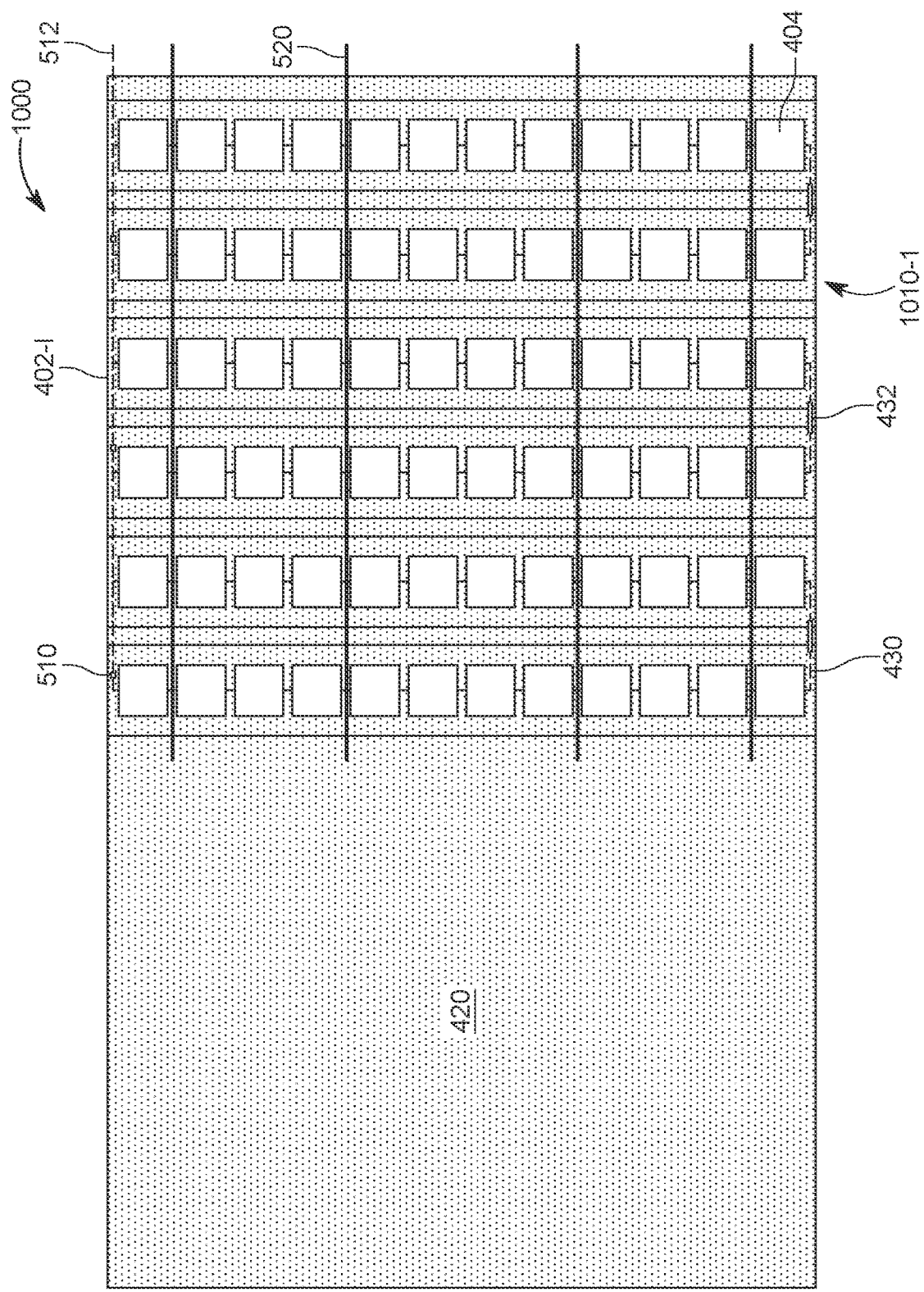
FIG. 10A illustrates the manufacturing of another photovoltaic module that uses a single foldable material that is shared by all the sections and lamellas.
Figure 10B:
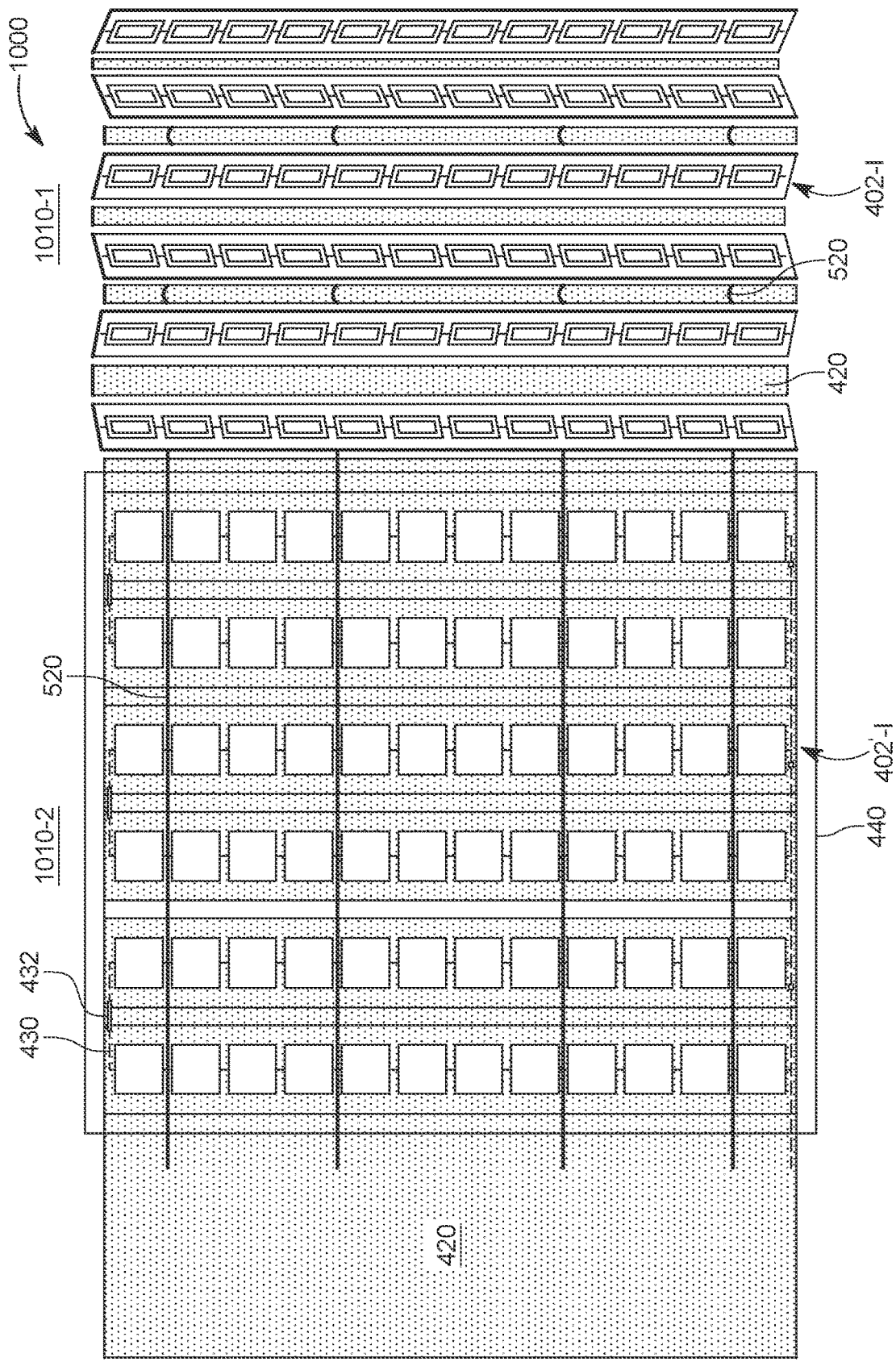
FIG. 10B illustrates how each photovoltaic section is built on top of the foldable material while another section is inside the vacuum laminator.

According to another embodiment, the PV module 700 discussed above may be manufactured differently, for example, to have a continuous foldable material 420, as illustrated in FIGS. 10A and 10B. This PV module 1000 has the foldable material 420 extending over the entire module, not only between lamellas as in the PV module 700. For this embodiment, the continuous foldable material 420 forms the basis of the entire PV module 1000, i.e., all the other components of the PV module 1000 are laid-up on top of the foldable material. FIG. 10A shows the formation of a first section 1010-1, only over a given area of the foldable material 420. The remaining area of the foldable material 420 is empty at this time. While the first section 1010-1 is placed in the vacuum laminator, the second section is laid-up, similar to the process illustrated in FIGS. 5B to 6. When the first section 1010-1 has been laminated, it is folded or rolled up outside the laminator, as illustrated in FIG. 10B, and the next section 1010-2 enters into the laminator. Note that the foldable material 420 being continuous, has all the time one area (corresponding to section) inside the laminator area 440 and all the other areas (the empty area and the areas covered by the previous sections 1010-1) outside the laminator. Similar to the process illustrated in FIGS. 5B to 6, the length of the PV module 1000 is not limited by the dimensions of the laminator, only by the overall dimensions of the foldable material 420.

Figure 11:
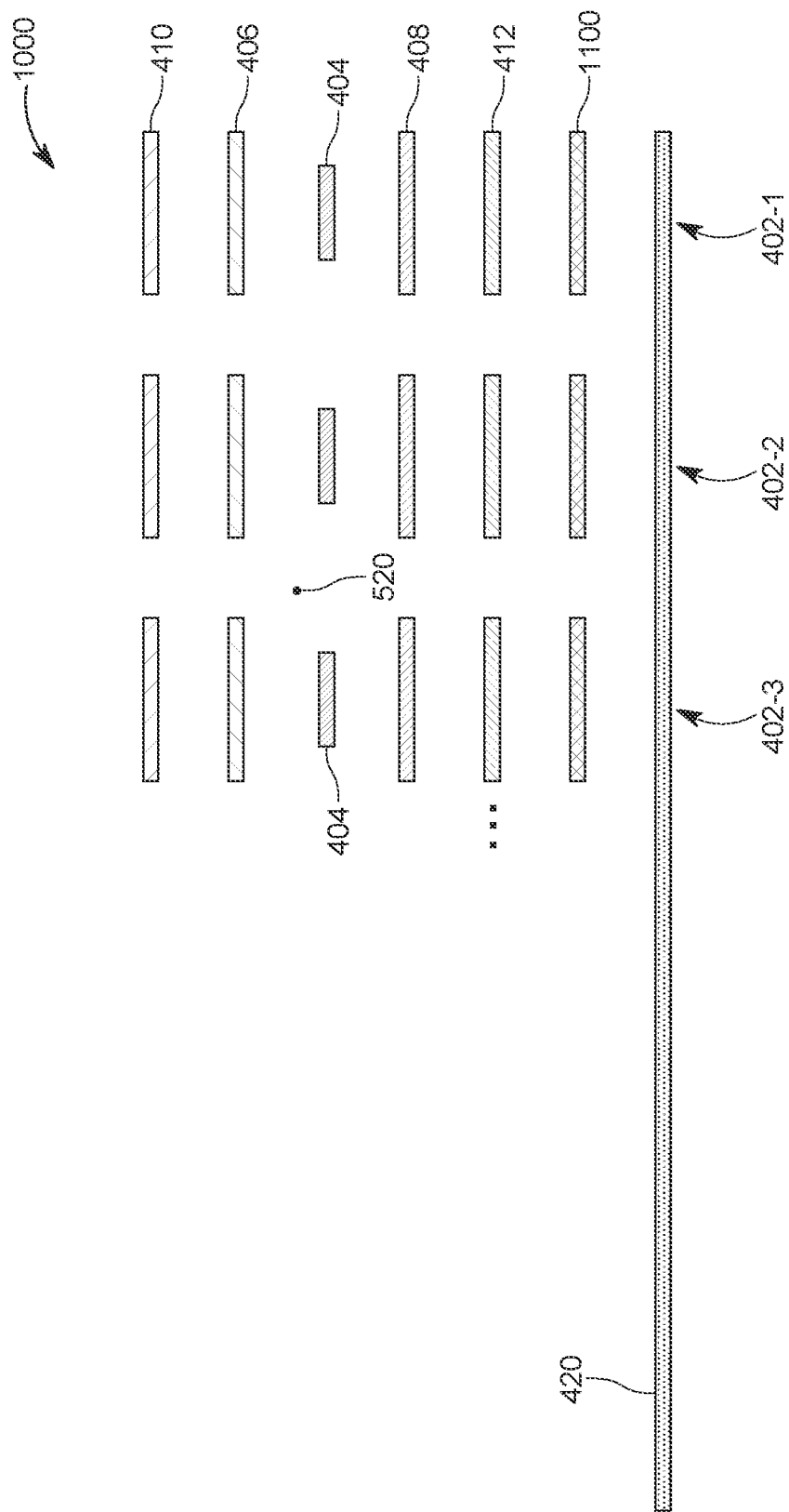
FIG. 11 schematically shows a layer configuration of the photovoltaic module of FIGS. 10A and 10B.

A cross-section view of the PV module 1000 is shown in FIG. 11. It is noted that the foldable material 420 extends at the bottom of the PV module (as the cells 404 are facing up in the figures), over the entire length of the module. It is also noted that an additional encapsulant material 1100 is added between the back sheet 412 of each lamella and the foldable material 420 so that the foldable material is adhered to each lamella during the lamination step. It is further noted that between adjacent lamellas, only the foldable material is present, which makes the entire PV module easily foldable up to any angle. The foldable material 420 can be chosen, for any of the embodiments discussed herein, to be optically transparent (e.g., larger than 60% transparency), or to be light diffusing, and/or air and moisture permeable, and non-flammable. In one application, the foldable material is chosen to be made of polyethylene terephthalate (PET) fiber sheets, glass fiber sheets, or other synthetic materials with variable size pores.

Figure 12A:
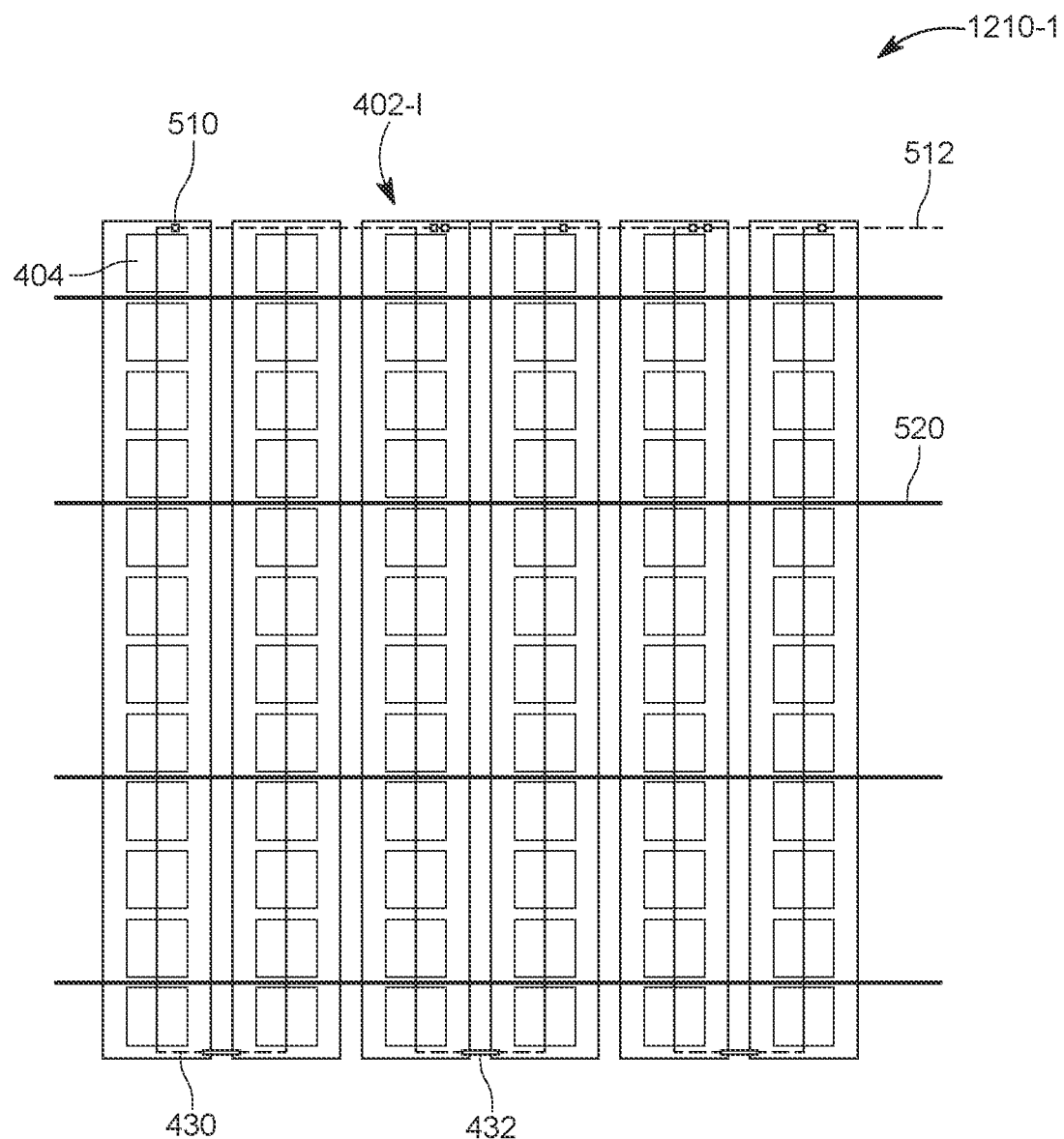
FIG. 12A illustrates the manufacturing of yet another photovoltaic module that uses a single foldable material which is shared by all the sections and lamellas.
Figure 12B:
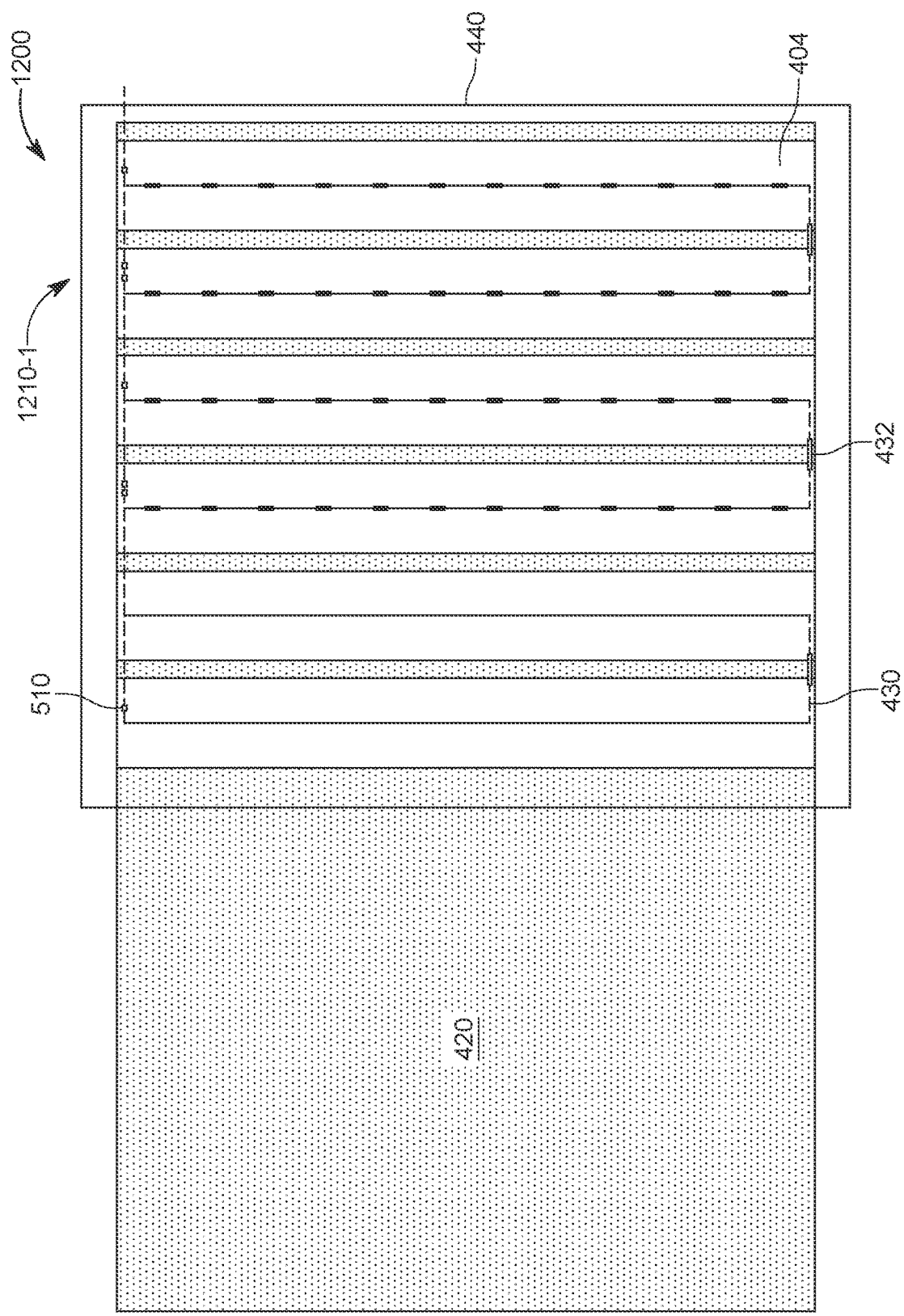
FIG. 12B illustrates how each photovoltaic section is build and then the single foldable material is added on top while another section is inside the vacuum laminator.
Figure 13:
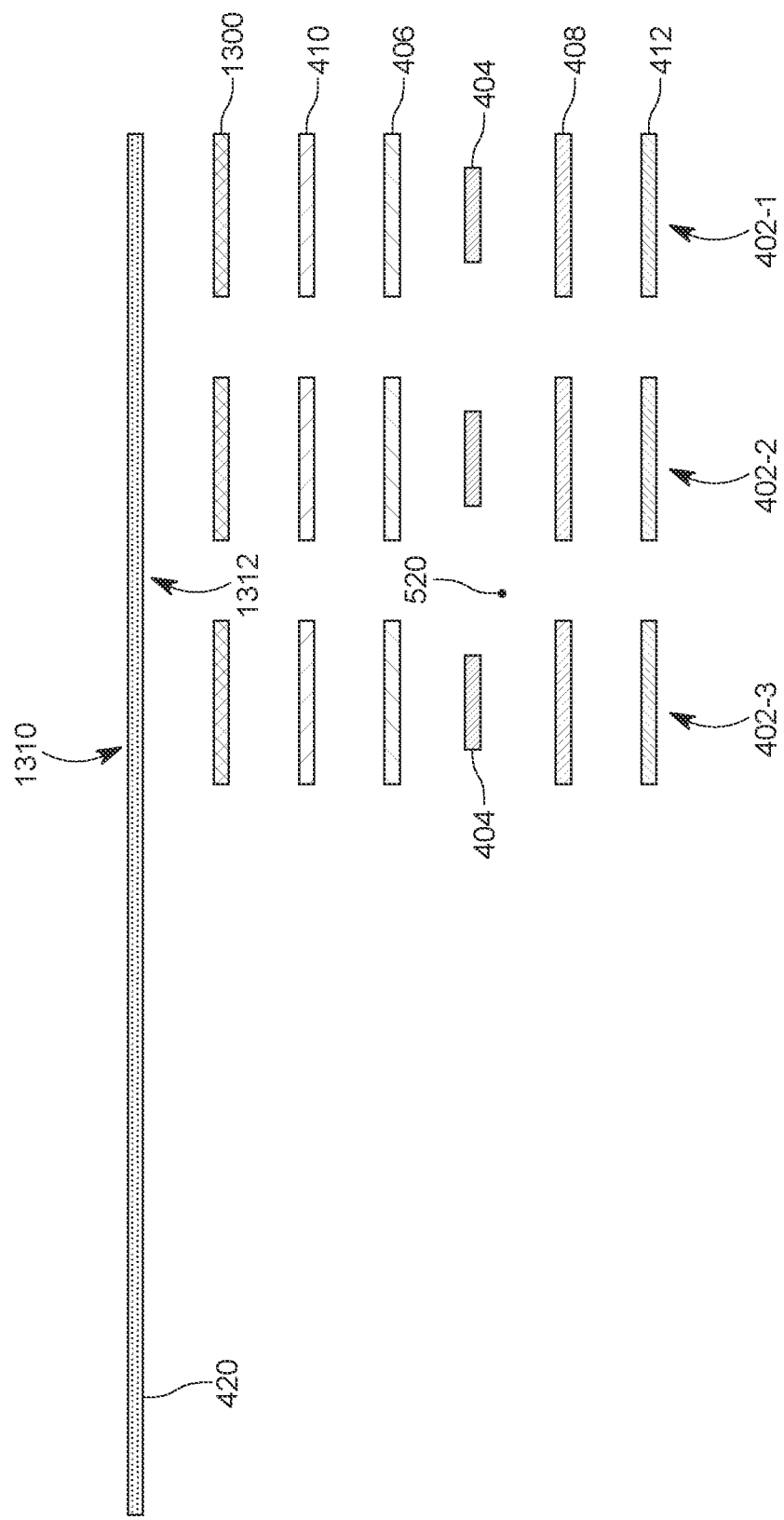
FIG. 13 schematically shows a layer configuration of the photovoltaic module of FIGS. 12A and 12B.

In yet another implementation, a PV module 1200 shown in FIGS. 12A and 12B is formed to have the foldable material 420 at the top of the sections. More specifically, as shown in FIG. 12A, the lamellas 402-*l* forming a section 1210-1 are first laid-up and interconnected, with no foldable material 420 present. Note that the cells 404 are facing down in this embodiment. Next, as illustrated in FIG. 12B, the foldable material 420 is placed over the laid-up section 1210-1 and the first section together with the corresponding portion of the foldable material 420 is placed into the active area 440 of the vacuum laminator. The foldable material 420 may have any length and it will be used to cover the following sections. A cross-section of the PV module 1200 with the foldable material 420 on top is shown in FIG. 13. Note that an encapsulant material 1300 (which may be the same as 1100) is placed between the foldable material 420 and the front sheet 410 for adhering the foldable material to each lamella. In this embodiment, the foldable material 420 is attached to each lamella of each section of the module 1200, with portions of the foldable material 420 being directly exposed on both sides to the ambient. In other words, an entire surface area 1310 of the foldable material 420, on one entire side of the material, is exposed to the ambient while a partial surface area 1312 of the material, on the opposite side of the material, is also exposed to the ambient. This is similar to the embodiment illustrated in FIG. 11. Note that if the folding material has pores, then air and humidity can pass from one side of the material to the other side at areas 1312.

Figure 14:
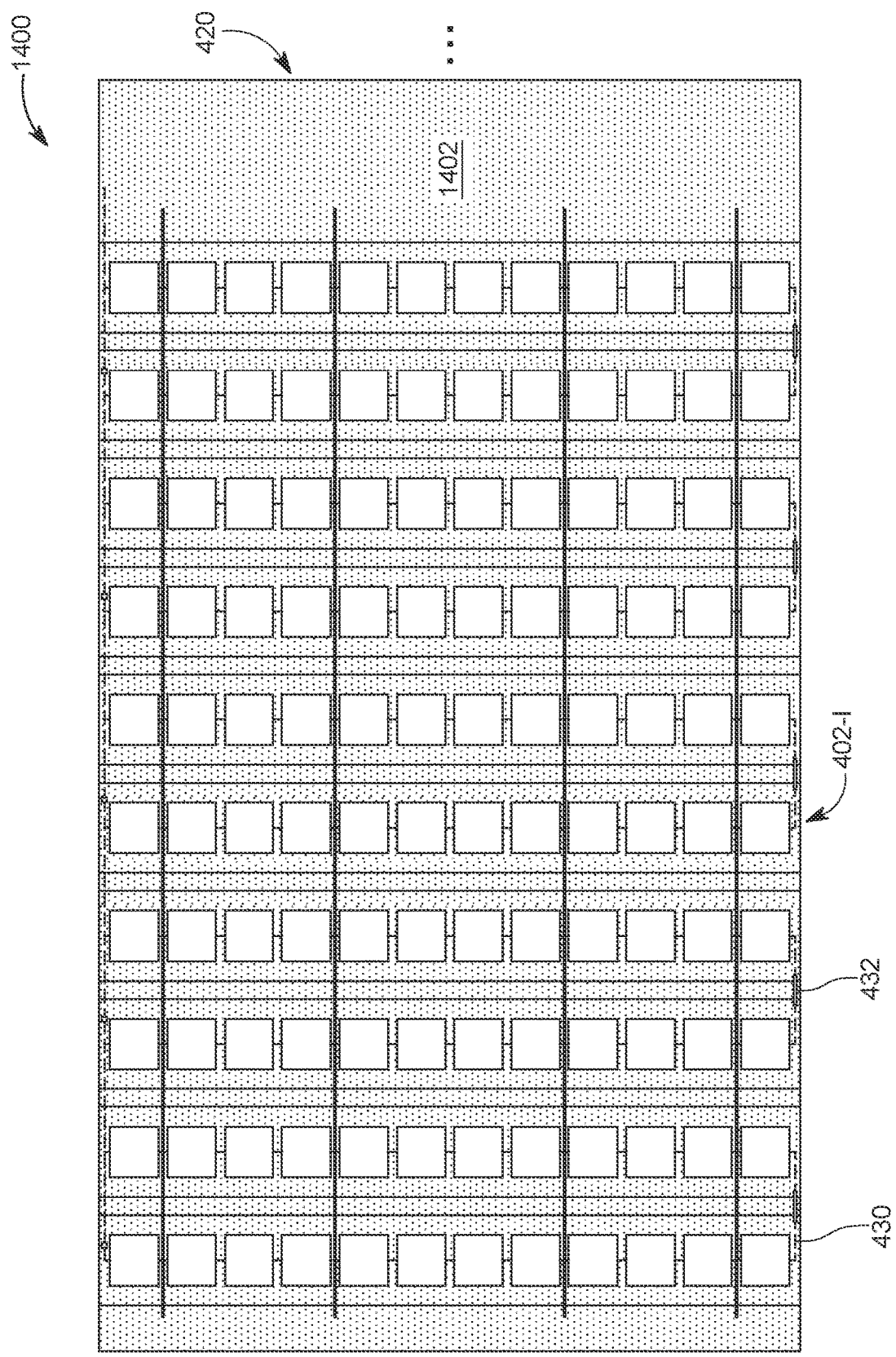
FIG. 14 schematically illustrates yet another photovoltaic module in which each lamella is glued to a common foldable material, post lamination.

In yet another implementation, as illustrated in FIG. 14, individual lamellas which were previously laminated and having a structure as shown in FIG. 3A, are placed over the foldable material 420 post-lamination. A layer of adhesive 1402 is spread over the foldable material 420 and each lamella 402-*l* is placed to contact the adhesive layer 1042, to stick to the foldable material 420. The adhesive may be epoxy, acrylic, etc. The lamellas are then electrically connected to achieve the electrical connections 430 and their exposed regions are covered with the insulator material 432. The length of the module 1400 is not limited as the length of the foldable material 420 may have any value.

Figure 16:
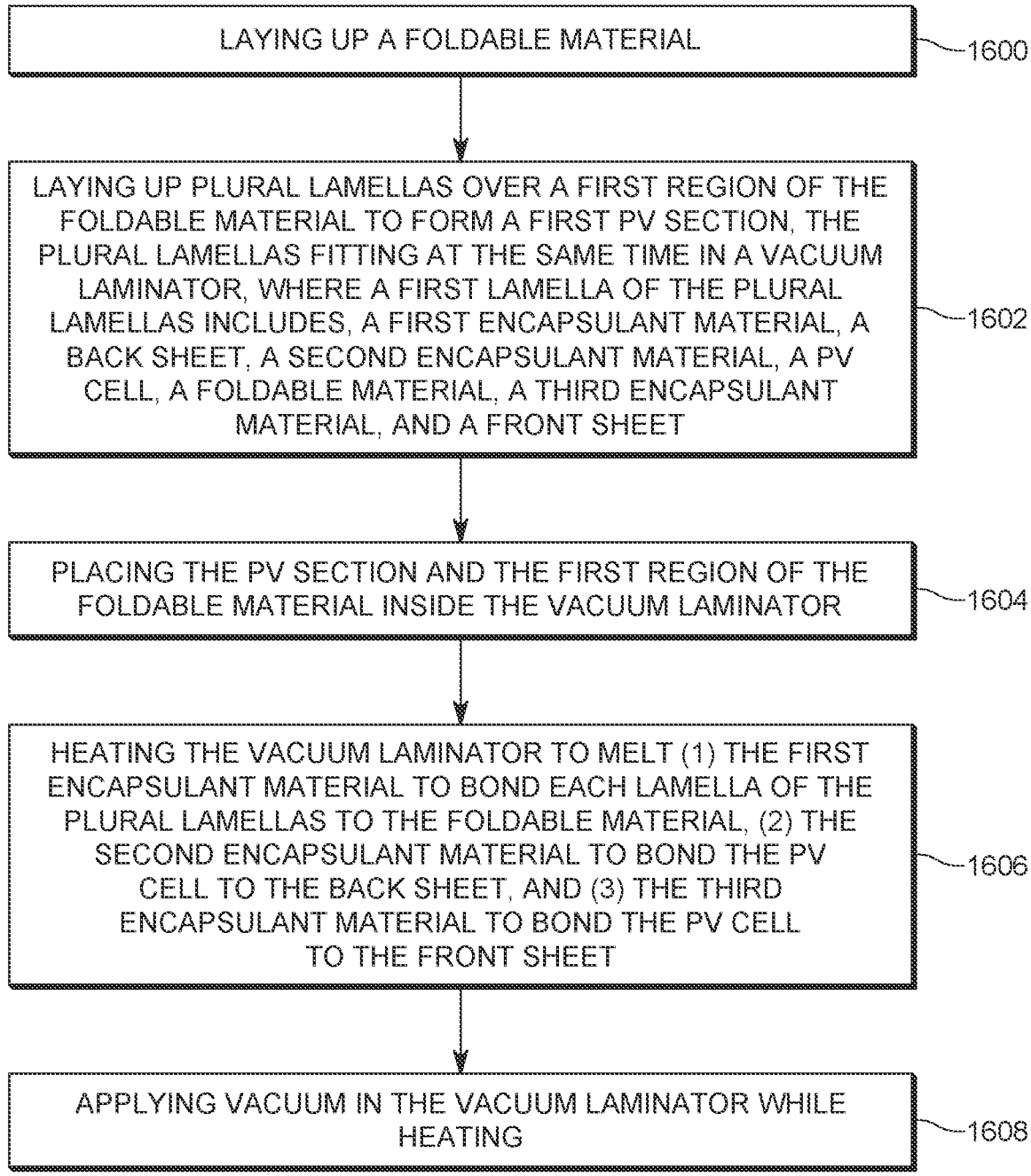
FIG. 16 is a flow chart of another method for forming one or more of the photovoltaic modules noted above.

The various PV modules discussed above may be manufactured as now discussed with regard to FIGS. 15 and 16. The PV module 500 may be manufactured, as illustrated in FIG. 15, by performing a step 1500 of laying up plural lamellas to form a first PV section 400, the plural lamellas fitting at the same time in a vacuum laminator, where a first lamella of the plural lamellas includes, in this order, a back sheet, a first encapsulant material, a PV cell, a foldable material, a second encapsulant material, and a front sheet. The method may also include a step of electrically connecting the plural lamellas of the given section to each other and a step of adding an insulator material over the electrical wires that are going to be exposed after the lamination process. The method further includes a step 1502 of placing the PV section 400 inside the vacuum laminator, a step 1504 of heating the vacuum laminator to (1) melt the first encapsulant material to bond the PV cell to the back sheet, (2) melt the second encapsulant material to bond the PV cell to the front sheet, and (3) melt the first and second encapsulant material to simultaneously bond (i) a first edge of the foldable material in the first lamella and (ii) a second edge of the foldable material to a second lamella of the plural lamellas. The method may also include a step 1506 of applying vacuum in the vacuum laminator while heating to remove any bubbles.

The method may also include laying up a second section of plural lamellas while the first and second encapsulant materials of the first section are being melted, where a portion of the foldable material of a last lamella of the first section is positioned between corresponding first and second encapsulant materials of a first lamella of the second section, and taking the first section out of the vacuum laminator and folding the first section while placing the second section in the vacuum laminator. The PV cell of the first lamella, the foldable material and a PV cell of the second lamella are distributed in a same plane.

The manufacturing of the PV modules 1000 and 1200 is now discussed with regard to FIG. 16. The method includes a step 1600 of laying up a foldable material, a step 1602 of laying up plural lamellas over a first region of the foldable material to form a first PV section, the plural lamellas fitting at the same time in a vacuum laminator, where a first lamella of the plural lamellas includes, a first encapsulant material, a back sheet, a second encapsulant material, a PV cell, a foldable material, a third encapsulant material, and a front sheet. The method further includes a step 1604 of placing the PV section and the first region of the foldable material inside the vacuum laminator, a step 1606 of heating the vacuum laminator to melt (1) the first encapsulant material to bond each lamella of the plural lamellas to the foldable material, (2) the second encapsulant material to bond the PV cell to the back sheet, and (3) the third encapsulant material to bond the PV cell to the front sheet, and a step 1608 of applying vacuum in the vacuum laminator while heating.

The method may further include a step of laying up a second section of plural lamellas over a second region of the foldable material while the first section is inside the vacuum laminator, and/or a step of taking the first section out of the vacuum laminator and folding the first section while placing the second section in the vacuum laminator with the first region of the foldable material being outside the vacuum laminator and the second region of the foldable material being inside the vacuum laminator.

The disclosed embodiments provide a lightweight, glass-free, rigid frame free, vacuum laminated solar module having a length not limited by a size of the vacuum laminator. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

The entire content of all the publications listed herein is incorporated by reference in this patent application.

[1] International Patent Publication WO 2020/157556

What is claimed is:

1. A photovoltaic, PV, module comprising:
    a common foldable material;
    a common hanging wire for hanging the PV module; and
    plural PV sections, each PV section including first and second lamellas, each of the first and second lamellas including,
        a first encapsulant material,
        a back sheet,
        a second encapsulant material,
        a PV cell,
        a third encapsulant material, and
        a front sheet,
    wherein the second encapsulant material is configured to bond the PV cell to the back sheet, and the third encapsulant material is configured to bond the PV cell to the front sheet,
    wherein each of the first and second lamellas is bonded to the common foldable material by the corresponding first encapsulating material, and
    wherein the common hanging wire extends through a width of each of the first and second lamellas, between the corresponding second and third encapsulating materials, and the common hanging wire further extends through a separation space between the first and second lamellas so that the common hanging wire is directly exposed to an ambient when crossing from the first lamella to the second lamella.

2. The PV module of claim 1, wherein the third encapsulating material of the first lamella is in direct contact with the front sheet of the first lamella.

3. The PV module of claim 1, wherein the first encapsulating material of the first lamella is in direct contact with the back sheet of the first lamella.

4. The PV module of claim 1, wherein the first and second lamellas are spaced apart along the common foldable material so that free regions of the common foldable material act as a hinge and the common foldable material is configured to be bent up to 180 degrees.

5. The PV module of claim 1, wherein the first and second lamellas are configured to fold or roll to reduce a footprint of the PV module.

6. The PV module of claim 1, further comprising:
    additional hanging wires extending through a length of the PV module, between the second and third encapsulant materials of each of the first and second lamellas.

7. The PV module of claim 1, wherein there is no glass layer or solid frame attached to any lamella or section.

8. The PV module of claim 1, further comprising:
    electrical wires electrically connecting the first and second lamellas, the electrical wires having portions embedded into each of the first and second lamellas that are not electrically insulated.

9. The PV module of claim 8, wherein the electrical wires have portions, that extend between the first and second lamellas, that are electrically insulated.

10. A photovoltaic, PV, section comprising:
    a common foldable material;
    a common hanging wire for hanging the PV section; and
    first and second lamellas,
    each of the first and second lamellas including,
        a first encapsulant material,
        a back sheet,
        a second encapsulant material,
        a PV cell,
        a third encapsulant material, and a front sheet, wherein the second encapsulant material is configured to bond the PV cell to the back sheet, and the third encapsulant material is configured to bond the PV cell to the front sheet, wherein each of the first and second lamellas is bonded to the common foldable material by the corresponding first encapsulating material, and wherein the common hanging wire extends through a width of each of the first and second lamellas, between the corresponding second and third encapsulating materials, and the common hanging wire further extends through a separation space between the first and second lamellas so that the common hanging wire is directly exposed to an ambient when crossing from the first lamella to the second lamella.

11. The PV section of claim 10, wherein the third encapsulating material of the first lamella is in direct contact with the front sheet of the first lamella.

12. The PV section of claim 10, wherein the first encapsulating material of the first lamella is in direct contact with the back sheet of the first lamella.

13. The PV section of claim 10, wherein the first and second lamellas are spaced apart along the common foldable material so that free regions of the common foldable material act as a hinge and the common foldable material is configured to be bent up to 180 degrees.

14. The PV section of claim 10, wherein the first and second lamellas are configured to fold or roll to reduce a footprint of a PV module.

15. The PV section of claim 10, further comprising:
additional hanging wires extending along a length of the PV section and located between the second and third encapsulant materials of each of the first and second lamellas.

16. The PV section of claim 10, further comprising:
electrical wires electrically connecting the first and second lamellas, the electrical wires having portions embedded into each of the first and second lamellas that are not electrically insulated.

17. The PV section of claim 10, wherein the electrical wires have portions, that extend between the first and second lamellas, that are electrically insulated.

\* \* \* \* \*